United States Patent
Kumar et al.

(10) Patent No.: US 11,416,977 B2
(45) Date of Patent: Aug. 16, 2022

(54) SELF-MEASUREMENT OF SEMICONDUCTOR IMAGE USING DEEP LEARNING

(71) Applicant: Applied Materials, Inc., Santa Clara, CA (US)

(72) Inventors: Abhinav Kumar, San Jose, CA (US); Tarpan Dixit, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 16/814,181

(22) Filed: Mar. 10, 2020

(65) Prior Publication Data
US 2021/0287354 A1 Sep. 16, 2021

(51) Int. Cl.
| | |
|---|---|
| G06T 7/62 | (2017.01) |
| G06F 17/15 | (2006.01) |
| G06N 3/08 | (2006.01) |
| G06T 7/10 | (2017.01) |
| G06T 7/00 | (2017.01) |

(52) U.S. Cl.
CPC ............ *G06T 7/0004* (2013.01); *G06F 17/15* (2013.01); *G06N 3/08* (2013.01); *G06T 7/10* (2017.01); *G06T 7/62* (2017.01)

(58) Field of Classification Search
None
See application file for complete search history.

(56) References Cited

U.S. PATENT DOCUMENTS

| | | | | |
|---|---|---|---|---|
| 5,124,927 A | * | 6/1992 | Hopewell | G03F 7/706 430/311 |
| 5,825,033 A | * | 10/1998 | Barrett | H01L 27/14658 250/370.09 |
| 2016/0155882 A1 | * | 6/2016 | Tian | H01L 31/1013 257/440 |
| 2016/0350445 A1 | * | 12/2016 | Dowski, Jr. | B24B 13/06 |
| 2017/0263478 A1 | * | 9/2017 | McChesney | H01J 37/20 |
| 2017/0357895 A1 | * | 12/2017 | Karlinsky | G06N 3/08 |
| 2019/0272623 A1 | * | 9/2019 | Mack | G06F 17/18 |
| 2020/0018944 A1 | * | 1/2020 | Fang | H01J 37/222 |
| 2020/0074610 A1 | * | 3/2020 | Pu | G06T 7/001 |
| 2021/0027473 A1 | * | 1/2021 | Oya | G01N 23/2251 |
| 2021/0216697 A1 | * | 7/2021 | Van Den Brink | G06F 30/392 |

OTHER PUBLICATIONS

Yu et al., "CASENet: Deep Category-Aware Semantic Edge Detection", CVPR, 2017, 16 pages.
Ronneberger et al., "U-Net: Convolutional Networks for Biomedical Image Segmentation", CVPR, 2015, 8 pages.
Long et al., "Fully Convolutional Networks for Semantic Segmentation", CVPR, 2015, 10 pages.

* cited by examiner

*Primary Examiner* — Idowu O Osifade
(74) *Attorney, Agent, or Firm* — Lowenstein Sandler LLP

(57) ABSTRACT

Methods, systems, and non-transitory computer readable medium are described for automated image measurement for process development and optimization. An example method may include receiving an image of a product associated with a manufacturing process, wherein the product comprises a plurality of structures; identifying, using a trained machine learning model, a segment of the image that comprises a structure of the plurality of structures; determining a plurality of image measurements of the segment that comprises the structure; and storing the plurality of image measurements.

21 Claims, 8 Drawing Sheets

SELF-MEASUREMENT OF SEMICONDUCTOR IMAGE USING DEEP LEARNING

TECHNICAL FIELD

The present disclosure relates to image measurement, and, more particularly, automated image measurement before, during, or after manufacturing.

BACKGROUND

Large amounts of images (e.g., of wafers, etc.) are generated by different industries (e.g., semiconductor industry, biomedical industry, display industry, photovoltaic industry, etc.). For example, thousands of images may be generated every month in a semiconductor laboratory during process development. To perform image measurements, a setup (e.g., recipe setup) may be created for measuring attributes (e.g., product width, height, etc.) of a first image. The setup may be run on the remaining images to measure attributes of the remaining images. If the remaining images have variations (e.g., variation in structure of the product, variations due to change in process and imaging conditions, etc.), the setup created based on the first image may not apply and a system using the setup may fail to measure the attributes of the remaining images. Due to this failure, the remaining images may be manually measured by process engineers. The manual measurements may include errors, may be subject to variations from one engineer to another engineer, and may take up much engineer time.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes receiving an image of a product associated with a manufacturing process, wherein the product comprises a plurality of structures. The method further includes identifying, using a trained machine learning model, a segment of the image that comprises a structure of the plurality of structures and determining a plurality of image measurements of the segment that comprises the structure; and storing the plurality of image measurements.

In another aspect of the disclosure, a system includes a memory and a processing device coupled to the memory. The processing device is to receive an image of a product associated with a manufacturing process, wherein the product comprises a plurality of structures. The processing device is further to identify, using a trained machine learning model, a segment of the image that comprises a structure of the plurality of structures and determine a plurality of image measurements of the segment that comprises the structure; and store the plurality of image measurements.

In another aspect of the disclosure, a non-transitory computer readable medium having instructions stored thereon, which, when executed by a processing device, cause the processing device to receive an image of a product associated with a manufacturing process, wherein the product comprises a plurality of structures. The processing device is further to identify, using a trained machine learning model, a segment of the image that comprises a structure of the plurality of structures and determine a plurality of image measurements of the segment that comprises the structure; and store the plurality of image measurements.

BRIEF DESCRIPTION OF THE DRAWINGS

The present disclosure is illustrated by way of example, and not by way of limitation in the figures of the accompanying drawings.

DETAILED DESCRIPTION

Figure 1:
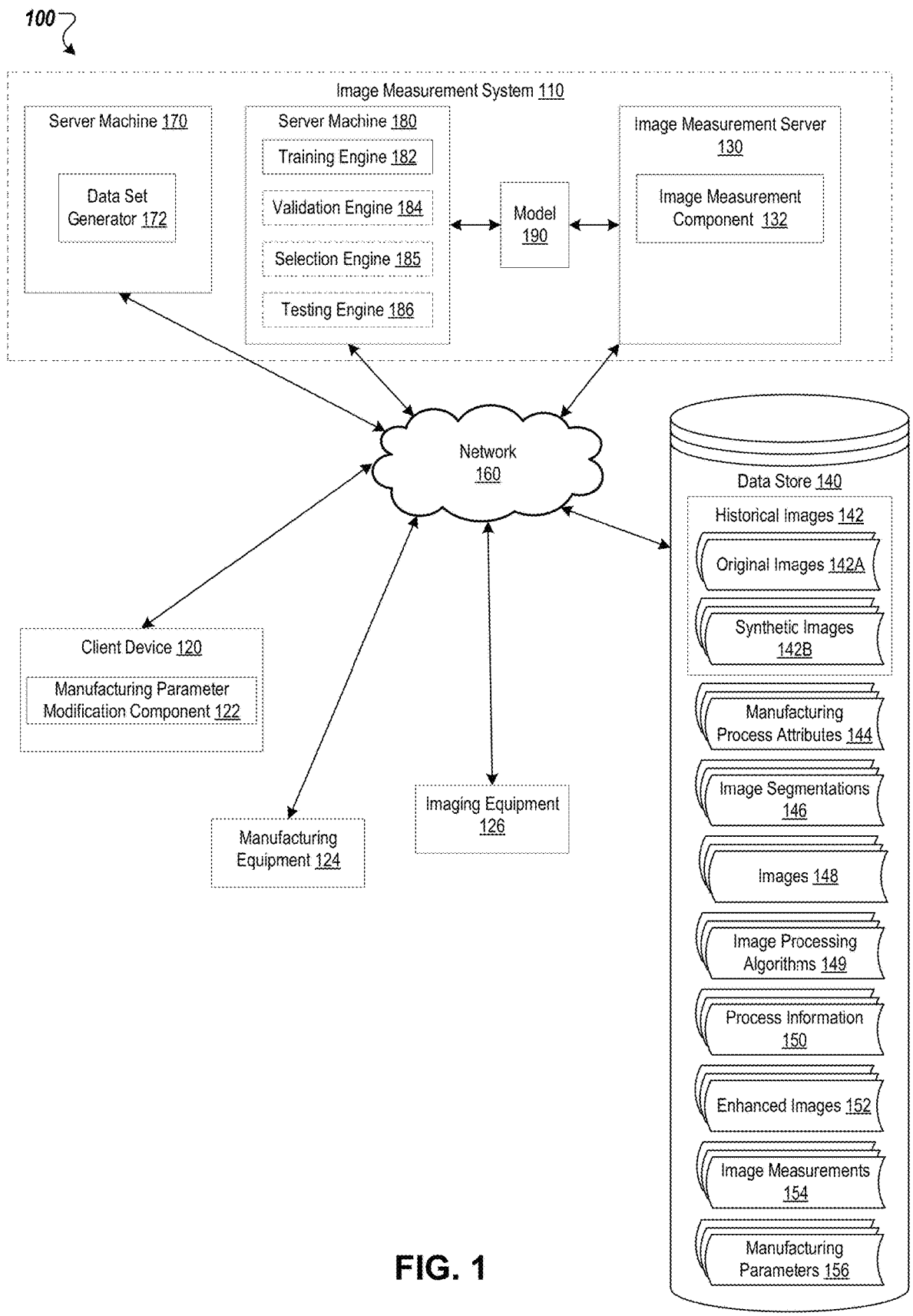
FIG. 1 is a block diagram illustrating an exemplary system architecture, according to certain embodiments.

Described herein are technologies directed to automated image measurement for faster process development and optimization (e.g., for faster semiconductor process development and optimization). In conventional systems, a user may create a setup (e.g., recipe setup) for measuring attributes (e.g., width, height, etc.) of product structures based on a first image and run the setup on remaining images to measure attributes of the remaining images. If the remaining images have variations, the setup created on the first image may not apply and a system using the setup may fail to measure the attributes of the remaining images.

Conventional systems may not be able to handle variations in structures in images responsive to changes in manufacturing processes and imaging conditions. For example, images may have one or more variations (e.g., due to different process or imaging conditions, etc.) including one or more of different contrasts, gradients, dark areas, colors, intensities, attributes with different dimensions (e.g., width, height, elongation), etc. A system that is to measure an attribute in an image by determining a distance from a first edge to a second edge may not be able to identify the first edge and second edge because of these variations. The system may either provide an erroneous measurement (e.g., distance between different portions of the image than the first edge and the second edge) or may fail to provide a measurement. Images with variations may be manually measured by process engineers. The manual measurements may include errors, may be subject to variations from one engineer to another engineer, and may take up much engineer time.

The technology disclosed herein may provide automated image measurement for faster process development and optimization by using a machine learning model. The technology may analyze may image data representing aspects of a product associated with a manufacturing process. The product may include structures on or within the product (e.g., holes, layers, trenches, or other product features) that have attributes that can be measured. The technology may involve receiving an image comprising a plurality of structures of a product associated with the manufacturing process. The technology may perform image segmentation, using a trained machine learning model, to identify a segment of the image that includes one or more structures. The image segment may indicate contours of the structures and may be used to determine image measurements of the structures.

The machine learning model may be a mathematical model that can be used to analyze data of an image and produce segmentation data that indicates locations of one or more structures in the image. The machine learning model may be a trained model that includes multiple layers (e.g., deep learning model). Some of the layers may include convolution and pooling operations that decrease the spatial resolution of the input data and some layers may include operations that increase the spatial resolution of the input data. The operations that increase the spatial resolution may take input data (e.g., input matrix) with a particular two dimensional resolution and increase the height, width, or a combination thereof. The operations that increase the spatial resolution may be the same or similar to deconvolution operations, upsampling operations, other operations, or a combination thereof. Increasing the two dimensional resolution of the input data may be particularly advantageous because it may enable the machine learning model to output data that has the same or similar spatial resolution as the input image. This enables the output segmentation data (e.g., one or more segmentation maps) to indicate the contours of structures in the image with more detail and therefore enable image measurements that are based on the segmentation map to be more accurate.

The technology may train the machine leaning model using a set of training images and the training images may include one or more synthetic images. A synthetic image may be based on an image that was captured by an image capturing device and has been modified to include one or more variations. The variations may affect any aspect of the image such as color, contrast, orientation and may be a modification to a particular portion or all portions of an image. A variation may be specific to one or more product structures represented in the image and may be based on process information about the manufacturing process used to create the product. In one example, the technology may identify features of a first original image that are expected to change based on manufacturing parameters of the manufacturing process. The processing device may generate a first synthetic image by performing targeted deformation of one or more of the structures in the first original image. The targeted deformation may adjust one or more aspects of a structure (e.g., generate synthetic images by deforming aspects of one or more structures that are expected to change based on the manufacturing parameters). The synthetic images, original images, or a combination thereof may be used to train the machine learning model to perform image segmentation.

The devices, systems, and methods disclosed herein may be able to handle large variation in structures (e.g., using a priori information of process structure and image processing algorithms to handle variations) for semiconductor process flow optimization (e.g., due to changes in processing or imaging conditions) and may be applicable to multiple image modalities (e.g., scanning electron microscope (SEM), cross-sectional SEM (XSEM), transmission electron microscope (TEM), top-down imaging, cross-section imaging, etc.). The image may be captured during research and development, manufacturing, packaging, assembly, production, testing, or other stage or process. The devices, systems, and methods disclosed herein may automatically measure different types of structures using images captured by different types of modality, without any user intervention, by identifying the structures present in an image automatically (e.g., instance segmentation) and applying image processing (e.g., to generate measurement statistics and optimize manufacturing processes, such as in semiconductor research and development laboratories). The devices, systems, and methods disclosed herein may not rely on user creation of a setup (e.g., recipe setup) before starting measurement on similar looking images. The automated process of image measurement, as disclosed herein, may avoid manual measurement error, avoid engineer-engineer variation, and free up engineer time. The devices, systems, and methods disclosed herein may not rely on user assistance for setup.

Aspects of the present disclosure result in technological advantages of significant reduction in energy consumption (e.g., battery consumption), bandwidth, processor overhead, and so forth. In some embodiments, the technological advantages result from using automated image measurement to determine image measurements of images with variations (e.g., variations due to change in process and imaging conditions, etc.) which reduces errors, variations from engineer to engineer, and user time compared to manual image measurement. The reduced error and engineer-to-engineer variations may result in less used bandwidth, lower processor overhead, and lower energy consumption (e.g., that would have otherwise been used to correct the errors, etc.). The automated image measurement of the present disclosure may result in faster process development and optimization (e.g., for semiconductor manufacturing processes). For example, manufacturing parameters of manufacturing processes may be updated based on the automated image measurements (e.g., of images with and without variations). The updated manufacturing parameters may be determined via the automated image measurements of the present disclosure which results in using less energy, less bandwidth, less processor overhead, less errors, less engineer-to-engineer variations, etc. than performing manual measurements. The updates to the manufacturing parameters determined via the present disclosure can produce products faster and that are optimized (e.g., more likely within specification) than conventional approaches.

FIG. 1 is a block diagram illustrating an exemplary system architecture 100, according to certain embodiments. The system architecture 100 includes image measurement system 110, client device 120, manufacturing equipment 124, imaging equipment 126, and a data store 140. The image measurement system 110 may include an image measurement server 130 and one or more server machines 170 and 180.

Imaging equipment 126 may include one or more of a scanning electron microscope (SEM), a cross-sectional SEM (XSEM), a transmission electron microscope (TEM), a top-down imaging device, a cross-section imaging device, etc. The imaging equipment 126 may provide images (e.g., historical images 142, images 148, etc.) of products (e.g., wafers, semiconductor devices, coatings, etched regions, implanted regions, etc.) associated with a manufacturing process (e.g., products processed by manufacturing equipment 124). The images may be stored in data store 140 and may be associated with image segmentations 146 (e.g., annotations outlining structures), manufacturing process attributes 144 (e.g., job attributes, manufacturing tool or equipment, project, customer, program, type of manufacturing process, manufacturing parameters 156, etc.

Client device 120, manufacturing equipment 124, imaging equipment 126, image measurement server 130, data store 140, server machine 170, and server machine 180 may be coupled to each other via a network 160 to determine image measurements 154 for determining updates to manufacturing parameters 156 of manufacturing processes. In some embodiments, network 160 is a public network that provides client device 120 with access to the image measurement server 130, data store 140, and other publically available computing devices. In some embodiments, network 160 is a private network that provides client device 120 with access to the image measurement server 130, data store 140, and other privately available computing devices. Network 160 may include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

Client device 120 may include computing devices such as personal computers (PCs), laptops, mobile phones, smart phones, tablet computers, netbook computers, network connected televisions ("smart TV"), network-connected media players (e.g., Blu-ray player), a set-top-box, over-the-top (OTT) streaming devices, operator boxes, etc. Client device 120 may be capable of receiving images (e.g., historical images 142, images 148) from imaging equipment 126, receiving image measurements 154 or updates to manufacturing parameters 156 from the image measurement system 110, etc. via the network 160. The client device 120 may access manufacturing process attributes 144, image segmentations 146, manufacturing parameters 156, etc. associated with images (e.g., by receiving data from one or more of the manufacturing equipment 124, imaging equipment, or data store 140). The client device 120 may be capable of transmitting images (e.g., historical images 142, images 148), manufacturing process attributes 144, image segmentations 146, manufacturing parameters 156, etc. to the image measurement system 110, receiving updates to manufacturing parameters 156 from the image measurement system 110, transmitting the updates to the manufacturing parameters 156 to the manufacturing equipment 124, etc. via the network 160. In some embodiments, client device 120 may modify manufacturing parameters (e.g., process parameters, hardware parameters, etc.) of the manufacturing equipment 124 based on the image measurements 154 or prior updates to the manufacturing parameters 156. Each client device 120 may include an operating system that allows users to generate, view, or edit data (e.g., image measurements 154, manufacturing parameters 156, etc.).

Client device 120 may include a manufacturing parameter modification component 122. Manufacturing parameter modification component 122 may receive user input (e.g., via a graphical user interface displayed via the client device 120) associated with images for automated image measurement. For example, the user input may indicate one or more of images, manufacturing process attributes 144, image segmentations 146, manufacturing parameters 156, a manufacturing process, manufacturing equipment 124, etc. In some embodiments, the client device 120 transmits the user input (e.g., images, manufacturing process attributes 144, etc.) to the image measurement server 130 and the client device 120 receives image measurements 154 from the image measurement server 130. Client device 120 may determine updates to the manufacturing parameters 156 of a manufacturing process and may cause the manufacturing parameters 156 of the manufacturing equipment 124 to be updated accordingly (e.g., transmit the updates to the manufacturing parameters 156 to the manufacturing equipment 124, implement the updates to the manufacturing parameters 156, etc.). In some embodiments, the image measurement server 130 determines the updates to the manufacturing parameters 156. In some embodiments, the image measurement server 130 or the client device 120 determine updates to the imaging parameters of the imaging equipment 126 and cause imaging parameters of the imaging equipment 126 to be updated (e.g., transmit the updates to the imaging parameters to the imaging equipment 126, implement the updates to the imaging parameters, etc.).

Image measurement server 130 may include one or more computing devices such as a rackmount server, a router computer, a server computer, a personal computer, a mainframe computer, a laptop computer, a tablet computer, a desktop computer, graphics processing unit (GPU), accelerator application-specific integrated circuit (ASIC) (e.g., tensor processing unit (TPU)), etc. The image measurement server 130 may include an image measurement component 132. In some embodiments, the image measurement component 132 may use images 148 and manufacturing process attributes 144 to determine image measurements 154. The results of the image measurements 154 may be used for updating manufacturing parameters 156 of a manufacturing process being developed). In some embodiments, the image measurement server 130 may use a trained machine learning model 190 to determine an image segmentation 146 for identifying a corresponding image processing algorithm 149 and corresponding process information 150 to generate an enhanced image 152 to be processed for determining image measurements 154.

Image measurement component 132 may receive (e.g., retrieve from the data store 140) an image 148 of a product (e.g., wafer) associated with a manufacturing process and manufacturing process attributes 144 associated with the manufacturing process. The image measurement component 132 may determine, using a trained machine learning model 190, an image segmentation for an input image and store it as image segmentation 146. The image measurement component 132 may provide image segmentation 146 as input to an image processing algorithm 149. The image measurement component 132 may pre-process the image 148 based on at least one of the image processing algorithm 149 or the process information 150 to generate an enhanced image 152 (e.g., image with segmentation metadata or layer). The image measurement component 132 may measure, using the image processing algorithm 149, one or more attributes (e.g., width of portions of the product, height of portions of the product, etc.) of the enhanced image 152 to determine image measurements 154 and may report the image measurements 154 (e.g., to the client device 120). The manufacturing parameters 156 of the manufacturing process (e.g., of the manufacturing equipment 124 on which the manufacturing process was performed) may be updated based on the image measurements 154.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store one or more of historical images 142, manufacturing process attributes 144, image segmentation 146, images 148, image processing algorithms, process information 150, enhanced images 152, image measurements 154, manufacturing parameters 156, etc. The historical images 142 may include original images 142A over a period of time or for a plurality of runs of the manufacturing equipment 124. The historical images 142 may include synthetic images 142B created based on the original images 142A. Each historical image 142 may correspond to a respective instance of manufacturing process attributes 144 (e.g., the instance of manufacturing parameters 156 used by the manufacturing equipment 124 to produce products corresponding to the historical image 142), image segmentation 146, etc.

Manufacturing parameters 156 may include one or more of settings (e.g., process parameters) or components (e.g., size, type, hardware parameters, etc.) of the manufacturing equipment 124. Manufacturing parameters 156 may include one or more of temperature (e.g., heater temperature), spacing (SP), pressure, high frequency radio frequency (HFRF), voltage of electrostatic chuck (ESC), current, a first precursor, a first dilutant, a second dilutant, a first reactant, a second reactant, a second precursor, gas flow rate for one or more gases, etc.

In some embodiments, the client device 120 may store one or more of historical images 142 (e.g., images used or to be used for training of a machine learning model), manufacturing process attributes 144, image segmentation 146, or images 148 (e.g., images input or to be input into a trained machine learning model to determine image segmentation 146) in the data store 140 and the image measurement server 130 may retrieve one or more of historical images 142, manufacturing process attributes 144, image segmentation 146, or images 148 from the data store 140. In some embodiments, the image measurement server 130 may store one or more of the image measurements 154 or manufacturing parameters 156 in the data store 140 and the client device 120 may retrieve one or more of image measurements 154 or manufacturing parameters 156 from the data store 140.

In some embodiments, image measurement system 110 further includes server machine 170 and server machine 180. The server machines 170 and 180 may be one or more computing devices (such as a rackmount server, a router computer, a server computer, a personal computer, a mainframe computer, a laptop computer, a tablet computer, a desktop computer, etc.), GPUs, ASICs (e.g., TPUs), data stores (e.g., hard disks, memories databases), networks, software components, or hardware components.

Server machine 170 may include a data set generator 172 that is capable of generating data sets (e.g., a set of data inputs and a set of target outputs) to train, validate, or test a machine learning model 190. Some operations of data set generator 172 are described in detail below with respect to FIG. 4. In some embodiments, the data set generator 172 may partition the historical images 142 (e.g., and corresponding manufacturing process attributes 144) and image segmentation 146 into a training set (e.g., sixty percent of the historical images 142), a validating set (e.g., twenty percent of the historical images 142), and a testing set (e.g., twenty percent of the historical images 142).

Server machine 180 may include a training engine 182, a validation engine 184, a selection engine, and/or a testing engine 186. An engine (e.g., a training engine 182, a validation engine 184, a selection engine, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training a machine learning model 190 using the training set from data set generator 172. The use of training engine 182, validation engine 184, selection engine 185, and testing engine 186 are discussed in more detail in regards to FIG. 5.

Training engine 182 may generate multiple trained machine learning models 190, where each trained machine learning model 190 corresponds to a distinct set of features (e.g., images 142, manufacturing process attributes 144) of the training set. For example, a first trained machine learning model may have been trained using all features (e.g., features X1-X5), a second trained machine learning model may have been trained using a first subset of the features (e.g., X1, X3, X5), and a third trained machine learning model may have been trained using a second subset of the features (e.g., X1, X3, X4, and X5) that may partially overlap the first subset of features.

Validation engine 184 may be capable of validating a trained machine learning model 190 using a corresponding set of features of the validation set from data set generator 172. For example, a first trained machine learning model 190 that was trained using a first set of features of the training set may be validated using the first set of features of the validation set. Validation engine 184 may determine an accuracy of each of the trained machine learning models 190 based on the corresponding sets of features of the validation set. Validation engine 184 may discard trained machine learning models 190 that have an accuracy that does not meet a threshold accuracy. In some embodiments, the selection engine 185 may be capable of selecting one or more trained machine learning models 190 that have an accuracy that meets a threshold accuracy. In some embodiments, the selection engine 185 may be capable of selecting the trained machine learning model 190 that has the highest accuracy of the trained machine learning models 190.

Testing engine 186 may be capable of testing a trained machine learning model 190 using a corresponding set of features of a testing set from data set generator 172. For example, a first trained machine learning model 190 that was trained using a first set of features of the training set may be tested using the first set of features of the testing set. The testing engine 186 may determine a trained machine learning model 190 that has the highest accuracy of all of the trained machine learning models based on the testing sets.

Machine learning model 190 may refer to the model artifact that is created or updated by training engine 182 when the training engine 182 analyzes the training set. The model may be mathematical model, a statistical model, other model, or a combination thereof. The model may be used to analyze data inputs, which may include image data, processing parameters, other data or a combination thereof and provide output data that includes one or more inferences. The output data may include image data, segmentation data, measurement data, other data, or a combination thereof. Training machine learning model 190 may involve identifying patterns in the data sets and adjusting weights and biases of the machine learning model 190 to indicate mappings between the input data and the output data. In one example, machine learning model 190 may be the same or similar to a convolutional neural network (CNN) and may include at least one convolutional operation as discussed in more detail in regards to FIG. 2.

Image measurement component 132 may analyze an image 148 and corresponding manufacturing process attributes 144 in view of trained machine learning model 190. Image measurement component 132 may be capable of deriving image segmentations 146 from image 148. The image segmentations 146 may or may not be associated with confidence data that indicates a level of confidence that image segmentation 146 is accurate. In one example, the level of confidence may be a real number between 0 and 1 inclusive, where 0 indicates no confidence in image segmentation 146 and 1 indicates absolute confidence in image segmentation 146 corresponding to the image 148. Image measurement component 132 may use the confidence data to decide whether to use image segmentation 146 for generating an enhanced image 152 or determining image measurements 154.

For purpose of illustration, rather than limitation, aspects of the disclosure describe the training of a machine learning model using historical images 142, image segmentation 146, manufacturing process attributes 144, or a combination thereof. The image segmentation may be associated with process information, image processing algorithms, image enhancement processes, and/or image measurement algorithms. Once an image segmentation 146 is determined for an input image, at least one of the image processing algorithms, and/or image enhancement processes may be used to enhance the image, and the associated image measurement algorithm (e.g., of the image processing algorithms) and/or process information may be used to automatically perform a measurement on the enhanced image. A result of the image measurement may be used for updating of manufacturing parameters 156. In other implementations, a heuristic model or rule-based model is used to determine image segmentation 146 for updating of manufacturing parameters 156 (e.g., without using a trained machine learning model). Image measurement component 132 may monitor historical images 142. Any of the information described with respect to data inputs 210 of FIG. 4 may be monitored or otherwise used in the heuristic or rule-based model.

In some embodiments, the functions of client device 120, image measurement server 130, server machine 170, and server machine 180 may be provided by a fewer number of machines. For example, in some embodiments server machines 170 and 180 may be integrated into a single machine, while in some other embodiments, server machine 170, server machine 180, and image measurement server 130 may be integrated into a single machine.

In general, functions described in one embodiment as being performed by client device 120, image measurement server 130, server machine 170, and server machine 180 can also be performed by image measurement server 130 in other embodiments, if appropriate. In addition, the functionality attributed to a particular component can be performed by different or multiple components operating together. For example, in some embodiments, the image measurement server 130 may transmit the updates to manufacturing parameters 156 to the manufacturing equipment 124. In another example, client device 120 may determine the image segmentation 146 based on output from the trained machine learning model 190.

In addition, the functions of a particular component can be performed by different or multiple components operating together. One or more of the image measurement server 130, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Although embodiments of the disclosure are discussed in terms of determining image measurements to update manufacturing parameters 156 of manufacturing equipment 124 in manufacturing facilities (e.g., semiconductor manufacturing facilities, biomedical facilities), embodiments may also be generally applied to determining measurements (e.g., of attributes with variations). Embodiments may be generally applied to optimizing process development.

Figure 2:
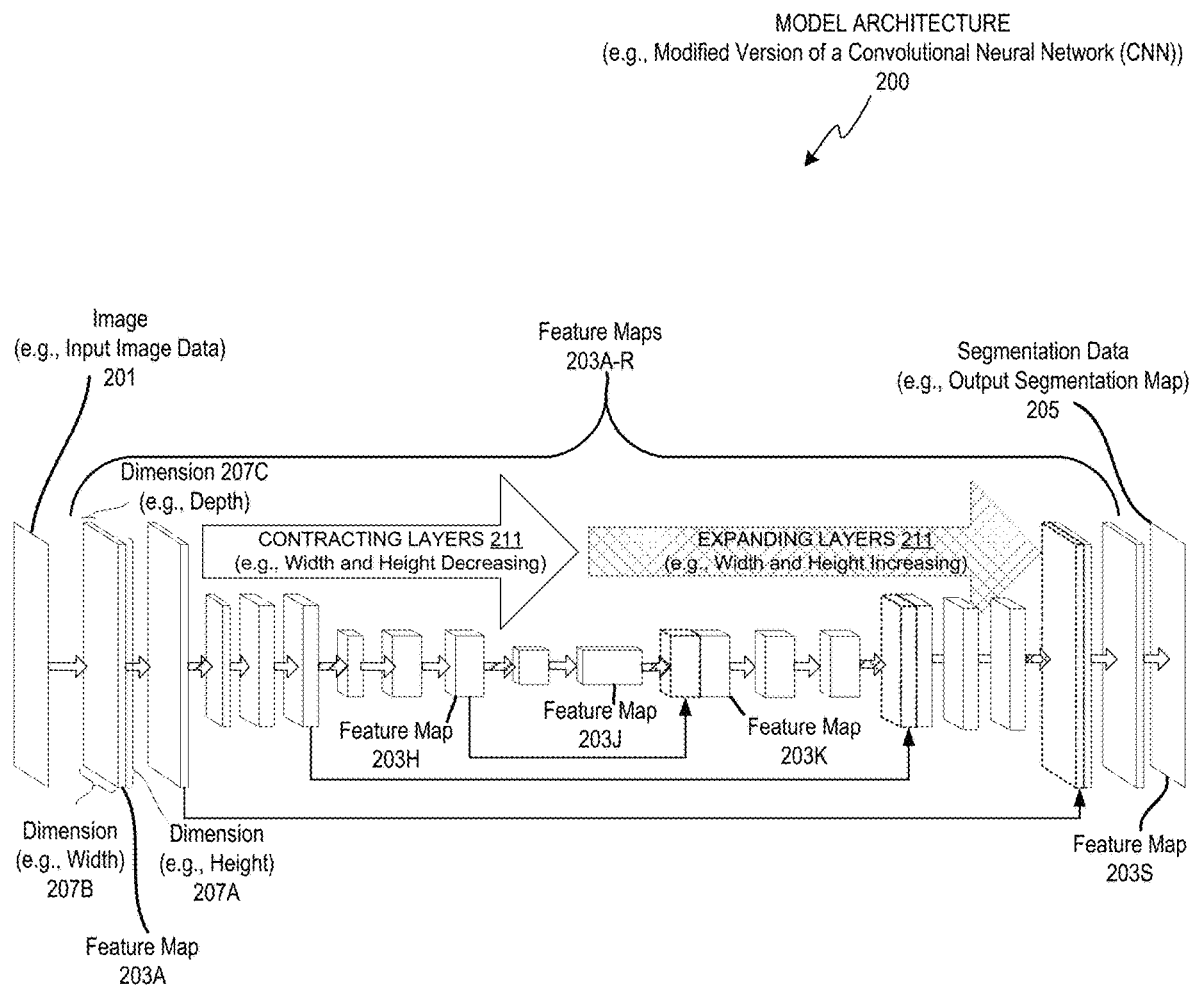
FIG. 2 is an example model architecture of a machine learning model, according to certain embodiments.

FIG. 2 is a block diagram illustrating an example model architecture 200 of machine learning model 190. Model architecture 200 may analyze input data in the form of image 201 and may process the input data to derive segmentation data 205. The term model architecture may be the same or similar to a machine learning architecture, a neural network architecture, network architecture, other term, or a combination thereof. In the example provided, model architecture 200 may be a modified version of a convolutional neural network (CNN) and may include one or more convolutional operations 207. Model architecture 200 may include one or more contracting layers 211 and one or more expanding layers 215 and may or may not have fully connected layers (e.g., absent fully connected layers). Model architecture 200 may be substantially symmetric and the number of contracting layers 211 and the number of expanding layers 215 may be the same or similar (e.g., off by one, or within 20% of each other). The symmetry of model architecture 200 may cause it to have a shape that resembles the letter "U." As such, model architecture 200 may be referred to as a u-shaped model architecture, u-shaped neural network (UNET), other term, or a combination thereof.

Image 201 may be provided as input to model architecture 200 and may include one or more images or image data derived from the one or more images. Image 201 may be based on one or more still images (e.g., pictures, photographs), video images (e.g., video frames), synthesized images (e.g., panoramic images), other images, or a combination thereof. Image 201 may include image data that represents pixel data (e.g., pixel values, resolution), device data (e.g., focal length, aperture, orientation, or other device property), file data (e.g., file size, creation time, owner, or other file property), other data, or a combination thereof. Image 201 may be stored as one or more data structures and the data structures may be the same or similar to files, records, streams, matrices, other data structures, or a combination thereof. In one example, image 201 may be a color image and have an image resolution of width w and height h (e.g., 1024×1024 pixels) and include d color channels (e.g., Red, Green, and Blue (RBG)). The input image may be received as or transformed into an N dimensional matrix (e.g., 3D matrix) and have a width w, a height h, and a depth d (e.g., 1024×1024×3). In another example, image 201 may be a grey scale image with an image resolution w×h and a single color channel d (e.g., grey scale) and may be represented as a 2 dimensional matrix (3×3 matrix) with a width w and a height h. In yet another example, image 201 may also or alternatively include depth data z (e.g., depth map, point cloud). The depth data may be incorporated as an additional channel to increase the number feature channels (RGB+Z) or may be incorporated as an additional dimension to produce an N-dimensional matrix (e.g., 2D→3D matrix).

Segmentation data 205 may be the output of model architecture 200 and may represent one or more image segments of image 201. Each image segment may be a portion of an image that may be associated with a particular classification. The portion of the image may include one or more regions of pixels that may be identified using a set of one or more pixel locations. The classification of the image segment may be a binary classification that indicates whether the region does or does not satisfy classification criterion. The classification criterion may be a binary classification (e.g., structures present or absent) or may be a non-binary classification that is able to distinguish between multiple instances of an object (e.g., structures absent, structural instance 1, structural instance 2, etc.). Segmentation data 205 may be stored in one or more segmentation data structures.

A segmentation data structure may be any persistent or non-persistent data structure that is cable of indicating the image segments associated with image 201. Segmentation data structure may function as a segmentation map and include a matrix with elements that map to different portions of image 201. Each element may have one or more values that represent a predicted or inferred classification for the corresponding pixels (e.g., pixel wise prediction). There may be a one-to-one mapping or a one-to-many mapping between an element of the segmentation map (e.g., matrix value) and a corresponding element or region of image 201 (e.g., individual, range, area, or volume of pixel values). In one example, segmentation data structure may have a spatial resolution that is smaller than the spatial resolution of image 201 and each element of the segmentation map may correspond to a set of pixels (e.g., 16×16 region). In another example, segmentation data structure may have a spatial resolution that is the same or similar to the spatial resolution of image 201 and each element of the segmentation map may correspond to a single pixel in image 201. The latter may be particularly advantageous because it may provide a one-to-one mapping between an entry in the segmentation data structure and a pixel in the image and may enable the image segmentation to more accurately indicate the contours (e.g., edges) of the structures that are identified using the convolution operations 209.

Convolution operations 209 may be mathematical operations that take one or more matrices as input and output a convolved matrix. Convolution operations 209 may generally refer to an integral of the product of the two functions after one is reversed and shifted. When applied to matrix input the convolution operation 209 may be equivalent to a sliding dot-product of two matrices that produces the convolved matrix. Convolution operations 209 may use one or more activation functions to produce data of the output matrix.

The activation function may be the same or similar to a transfer function and may define the output of an element given an input or set of inputs. In one example, the activation function may be a rectifier function that is defined as $f(x)=x+=\max(0, x)$ and may receive negative and positive inputs and may output values that are greater than or equal to zero and are absent negative values. The rectifier function may be implemented by a Rectifier Linear Unit (ReLU) and may be the same or similar to a ramp function and may be analogous to half-wave rectification in electrical engineering. In other examples, the activation function may be a logistic sigmoid function, a hyperbolic tangent function, a threshold function, other function, or a combination thereof.

Convolution operations 209 may receive two matrices as input. A first matrix may be a larger matrix that is based on image 201 (e.g., image matrix or subsequent feature map) and a second matrix may be a smaller matrix that functions as a filter kernel. The filter kernel may also be referred to as a convolutional kernel, a convolutional matrix, a filter, a kernel, or other term. As used herein, the term convolution may refer to the mathematical operation, the process of computing a resulting matrix, or the resulting matrix of the mathematical operation. The convolved matrix may be an updated version of one of the input matrices or may be a new matrix that is based on one of the input matrices. In the example shown in FIG. 2, convolution operations 209 may produce the majority of feature maps 203A-S.

Feature maps 203A-S may include one or more matrices that are the result of mathematical operations performed on image data. The mathematical operations may be convolution operations 209 discussed above or resolution reduction operations 213, resolution enlargement operations 217, other operations, or a combination thereof. Each feature map may be referred to as an activation map and may include an output matrix of values. The matrix may have a plurality of matrix elements (e.g., entries) that each include one or more values (e.g., numeric values). The elements may be arranged along one or more dimensions (e.g., 1D flattened matrix, 2D matrix, 3D matrix, N dimensional matrix). In the example shown in FIG. 4, feature map 203A may one or more dimensions 207A-C.

Dimensions 207A-C may indicate the number of elements the matrix has in each of the dimensions. In one example, a feature map may be displayed as multiple two dimensional matrices with dimensions 207A and 207B that are layered adjacent to one another (e.g., not shown) or may be displayed as a single three dimensional matrix having a depth equal to the number of layers. Each of dimensions 207A-C may correspond to an axis and one or more of axis may be perpendicular to one another (e.g., x axis, y axis, z axis, t axis, or other axis). Dimension 207A may be along a first axis (e.g., vertical axis) and may correspond to a height of the matrix. The height of the matrix may indicate a number of rows in the matrix. Dimension 207B may be along a second axis (e.g., horizontal axis) and may correspond to a width of the matrix. The width of the matrix may indicate a number columns in the matrix. Dimension 207C may be along a third axis and may correspond to a depth of the matrix (e.g., layer depth). The depth may indicate the number of layers in the matrix and may correspond to the number of feature channels or number convolved matrices. Each layer in the depth may be an output of a convolution and each layer may have one or more dimensions (e.g., a two dimensional matrix layer). In other examples, feature maps may include more or less dimensions or a different arrangement of dimensions (e.g., dimension 207A is width or depth instead of height). In the example in FIG. 2, dimensions 207A and 207B (e.g., height and width) may be referred to as the spatial dimensions and dimension 207C (e.g., depth) may be a feature channel dimension. One or more of dimensions 207A-C may be multiplied together to determine the resolution of the feature map.

The resolution of a feature map may be calculated based on one or more dimensions of an n-dimensional matrix. In one example, the resolution may be a two dimensional resolution of an N dimensional matrix. The two dimensional resolution may be determined by multiplying the height and width of the matrix (e.g., dimension 207A and 207B) and be referred to as the spatial resolution (e.g., 2 dimensional area). In another example, the resolution may be a three dimensional resolution of an N dimensional matrix (N>3) and the resolution may be referred to as a volume resolution. In either example, the term resolution may refer to the pixel resolution, other resolution, or a combination thereof.

The resolution of an output matrix (e.g., feature map) may be the same or different from the resolution of an input matrix (e.g., input image 201). In one example, one of the convolution operations 209 may use padding and the resolution of the input matrix and the output matrix may have the same resolution (e.g., both width and height remain constant). In another example, one or more of the convolution operations 209 may be absent padding and the output matrix may be smaller than the input matrix. For example, the width and height of the output matrix may decrease based on the width and height of the filter kernel (e.g., a 3×3 kernel decreases both the width and height by 2). As shown in FIG. 2, model architecture 200 may cause the resolution of feature maps to decrease, increase, or a combination thereof as illustrated by contracting layers 211 and expanding layers 215.

Contracting layers 211 indicates the one or more layers of model architecture 200 that reduce the resolution of the matrices (e.g., height and width of a matrix). Reducing the resolution of a matrix may involve reducing at least one dimension of the feature map matrix and the other dimensions of the feature map matrix may remain constant or increase. In one example, multiple dimensions of the output matrix may be less than the corresponding dimensions of the input matrix but one of the dimensions may get larger. For example, the height and/or width of the output matrix may decrease by a factor of X (e.g., 2, 3, 4, etc.) but the depth (e.g., number of layers) may increase by a factor or Y (e.g., 2, 3, 4, etc.). The reduction in the resolution may be caused by resolution reduction operations 213.

Resolution reduction operations 213 may include mathematical operations that reduce the number of elements in one or more dimensions of a matrix. A resolution reduction operation may be the same or similar to a downsampling, resampling, convolving, decimation, other operation, or a combination thereof. Resolution reduction operations 213 may be advantageous because they may provide a degree of translational invariance to the representative features contained within the input matrix (e.g., image or feature map) and may enable the model architecture to be more robust to variations in pixel positions (e.g., spatially invariant). Resolution reduction operations 213 may also reduce the computing resources (e.g., processing and/or storage resources) used to process and store the resulting feature maps.

Resolution reduction operations 213 may include pooling operations, dilated convolutions, other operations, or a combination thereof. In one example, resolution reduction operation may be a pooling operation in which a feature map matrix is divided into rectangular sub-regions, and the feature elements in each rectangle of an input matrix are independently down-sampled to a single feature element in the output matrix. The down sampling may involve analyzing values in the sub-region and taking the maximum value (e.g., max pooling), average value (e.g., average pooling), statistical value (e.g., stochastic pooling), other mathematically or statistically calculated value, or a combination thereof. In another example, the resolution reduction operations 213 may also or alternatively include a dilated convolution. A dilated convolution (e.g., atrous convolution) may involve using a filter kernel that has been dilated and includes spacing between the kernel elements. For example, a 3×3 kernel with a dilation rate of 2 will have the same field of view as a 5×5 kernel but every second column and row will be missing a kernel element, therefor it may appear like a 5×5 kernel but only include 9 parameters instead of 25 parameters.

Expanding layers 215 include one or more layers of model architecture 200 that enlarge the resolution of the feature map matrices (e.g., height and width of a matrix). Enlarging the resolution of a matrix may involve enlarging at least one dimension of the matrix and the other dimensions of the matrix may remain constant or decrease. Each of the expanding layers 215 may increase the spatial resolution of an input feature map by a multiple of X (e.g., any real number)) and there may be Y consecutive expanding layers (e.g., any integer value). Therefore, the increase in resolution of the feature map may be X*Y*[initial spatial resolution]. The enlargement in the resolution may be caused by resolution enlargement operations 217.

Resolution enlargement operations 217 may include mathematical operations that enlarge the number of elements in one or more dimensions of an input matrix. A resolution enlargement operation may take one or more matrices as input and modify the resolution of at least one of the matrices. Resolution enlargement operations 217 may involve interpolation, deconvolving, transposed convolution, upconvolving, upsampling, resampling, extrapolation, inverse filtering, other operation, or a combination thereof. In one example, resolution enlargement operations 217 may involve one or more interpolation operations (e.g., bilinear interpolation) that calculates each output element from the nearest input elements using a linear map that depends on the relative positions of the input element and output elements. In another example, resolution enlargement operations 217 may include a deconvolution using one of the convolution operations 209 discussed above with a stride rate that is less than 1 (e.g., ½, ⅓, ¼, etc.). A deconvolution may involve one or more deconvolution operations and may be referred to as a reverse pooling or reverse convolving because the deconvolution may reverse the effects of one or more pooling and/or convolution operations. Deconvolution operations may be the same or similar to backward convolutions, transposed convolutions, fractionally strided convolutions, other operation, or a combination thereof. The filter kernel that is used for the deconvolution (e.g., deconvolution filter) may be fixed, learned during training, based on one of the convolutional kernels, or a combination thereof. In some or all of the examples, the resolution enlargement operations 217 may use context information derived from different depth layers (e.g., feature channels) to increase the resolution. The increase in the resolution may be advantageous because it may make the resolution of the feature map closer (e.g., same or similar) to the resolution of the input image. Resolution enlargement operations 217 may result in an output feature map that is much larger than the feature map received from the contracting layers 211 and may use data from a map reuse operation 219 to populate entries in the larger feature map.

Map reuse operation 219 may enable model architecture 200 to use data of a prior feature map in one of the contracting layers 211 to derive a subsequent feature map in one of the expanding layers 215. The reuse may involve copying, cropping, or otherwise using one or more entries in a prior feature map as input to the formation of the subsequent feature map in the expanding layer. Map reuse operations 219 may be performed before, during, or after the resolution enlargement operation 217. For example, one of the resolution enlargement operations 217 may take as input a first feature map from one of the contracting layers (e.g., feature map 203J) and a second feature map (e.g., feature map 203H) and may derive a third feature map (e.g., feature map 203K). The first feature map may have a spatial resolution (e.g., 122×122) that is smaller than the second and third feature maps (e.g., 244×244).

A resolution enlargement operation 217 may use entries from both the first feature map and the second feature map to derive entries in the third feature map. For example, the first feature map may undergo a resolution enlargement operation that maps a single element in the first feature map to a portion of a block of elements (e.g., center element of a 3×3 block) and the remaining elements of the block may be supplemented with entries from the second feature map, which may have the same or similar spatial resolution as the third feature map. Each of the remaining elements in the block may be absent an entry (e.g., null value, default value, base value) or may have a value based on the first feature map that may or may not be used when determining the final value. In one example, the entries in the second feature map may be used directly and copied into the third feature map. In another example, the entries in the prior feature map may be used indirectly and may be input to a mathematical operation to derive the entries in the third feature map.

In one example, model architecture 200 may receive an image 201 and process the image using N layers (e.g., 19 layers) and each layer may result in one of the output feature maps 203A-S. Feature maps 203A-J may be a first set of features maps that are the output of contracting layers 211 and feature maps 203K-203S may be a second set of feature maps that are the output of expanding layers 215. Image 201 may include image data with a spatial resolution of 1024× 1024 and a depth of d (e.g., 1 for grey scale or 3 for color). Each of feature maps 203A-J in the contracting layers may have consecutive decreasing spatial resolutions because of the respective convolving and pooling layers. The consecutively decreasing spatial resolutions may be in the following sequence, 1022×1022 with 32 depth layers (feature map 203A), 1020×1020 with 32 depth layers (feature map 203B), 510×510 with 64 depth layers (feature map 203C), 508×508 with 64 depth layers (feature map 203D), 506×506 with 64 depth layers (feature map 203E), 253×253 with 64 depth layers (feature map 203F), 253×253 with 64 depth layers (feature map 203G), 251×251 with 128 depth layers (feature map 203H), 249×249 with 128 depth layers (feature map 203I), 124×124 with 128 depth layers (feature map 203J).

The consecutive feature maps that are in the expanding layers (e.g., feature maps 203K-S) may cycle between increasing spatial resolution and decreasing spatial resolution. This is because the convolving layers may decrease the spatial resolution slightly (e.g., lose boarder elements when unpadded) and subsequently increase the spatial resolution in the upsampling layers due to the resolution enlargement operations 217. In one example, the spatial resolutions of the feature maps in the expanding layers 215 may be in the following sequence, 244×244 with 256 depth layer (feature map 203K), 242×242 with 128 depth layer (feature map 203L), 240×240 with 128 depth layer (feature map 203M), 480×480 with 128 depth layer (feature map 203N), 478×478 with 64 depth layer (feature map 203O), 476×476 with 64 depth layer (feature map 203P), 952×952 with 64 depth layer (feature map 203Q), 950×950 with 32 depth layer (feature map 203R), 948×948 (feature map 203S). The last feature map (e.g., feature map 203S) may have its depth reduced to one or more depth layers and may function as the output segmentation map of model architecture 200. The output segmentation map may then be input for one or more image processing steps as discussed below in regards to FIG. 3.

Figure 3:
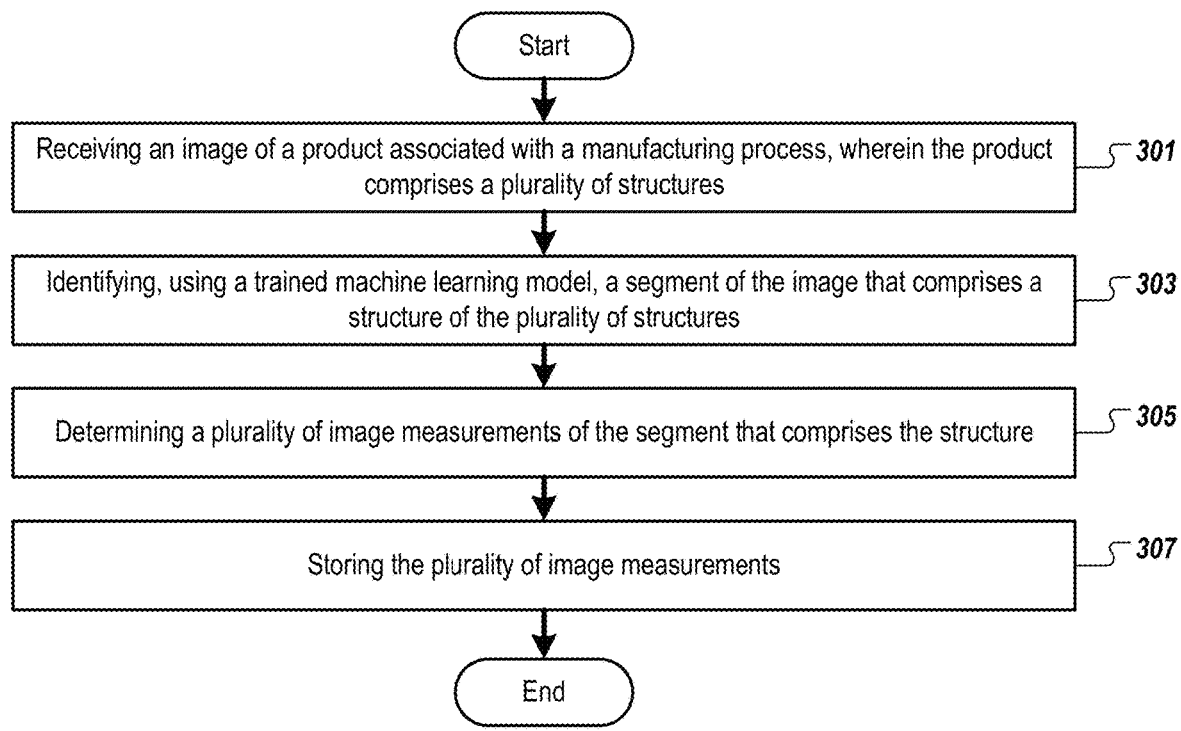
FIG. 3 is a block diagram illustrating an example method of determining image measurements using the machine learning model, according to certain embodiments.

FIG. 3 depicts a flow diagram of one illustrative example of a method 300 for analyzing an image of a product to automatically determine measurements of product structures, in accordance with one or more aspects of the present disclosure. The measurements may be image measurements used to determine, for example, critical dimensions of a semiconductor structure. The image measurements may be used for updating manufacturing parameters in some example implementations (e.g., manufacturing parameters 156 of FIG. 1). The processing logic (e.g., via method 300) may enable complete automation for image measurement so that no user intervention and recipe creation is performed.

Method 300 and each of its individual functions, routines, subroutines, or operations may be performed by one or more processors of the computer device executing the method. In certain implementations, method 300 may be performed by a single computing device. Alternatively, methods 300 may be performed by two or more computing devices, each computing device executing one or more individual functions, routines, subroutines, or operations of the method. For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 300 may be performed by systems and/or devices shown in FIGS. 1 and 2.

Method 300 may be performed by processing devices of a server device or a client device and may begin at block 301. At block 301, a processing device may receive an image of a product associated with a manufacturing process. The product may include one or more structures (e.g., features of a semiconductor chip). The image may include image data and may be received from an image capturing device (e.g., camera, microscope, or other sensor device), a data storage device (e.g., memory, hard disk drive (HDD), solid state drive (SSD)), a communication channel (e.g., network connection, system bus, hardware adapter), other device, or a combination thereof. The processing device may receive the image in response to submitting a request or may be transmitted the image without explicitly requesting the image. In either example, the processing device may access image data of the image and may analyze, transform, store, or process the image data.

At block 303, the processing device may identify, using a trained machine learning model, a segment of the image that comprises a structure of the plurality of structures. The processing device may initiate or execute an inference engine that takes as input the trained machine learning model and the image data. The inference engine may calculate one or more inferences based on the image data and output segmentation data based on the one or more inferences. The segmentation data may be in the form of a segmentation map that is generated by the processing device and indicates pixels of the image that correspond to a particular product structure or group of product structures. In one example, identifying the segment may involve performing image segmentation using the trained machine learning model to identify a plurality of segments. Each of the segments may include multiple structures (e.g., semantic segmentation) or may include a particular structure of the plurality of structures (e.g., semantic instance segmentation). In the latter instance, the semantic instance segmentation may be capable of distinguishing between different structures that are adjacent to one another or spread throughout the image.

The machine learning model may be a convolutional neural network that comprises at least one convolution operation that decreases the spatial resolution of image data and at least one deconvolution operation that increases the spatial resolution of the image data. The deconvolution operation may involve a convolution operation that uses a stride rate that is less than one. Training the machine learning model may involve accessing a first set of images that includes an image that is generated by an image capturing device and is annotated to indicate a portion of the first image comprising a structure of a product. The processing device may create a second set of images based on the first set of images. The second set of images may include a synthetic image that comprises a variation to the first image based on one or more changes in manufacturing parameters. The machine learning model may then be trained using the first set of images, the second set of images, or a combination thereof. The creation of synthetic images is discussed in more detail in regards to FIGS. 7-8.

At block 305, the processing device may determine a plurality of image measurements of the image segment that includes the structure. Determining the image measurements may involve detecting a first edge of the image segment that includes the structure. An image segment includes the structure if at least a portion of the structure is represented within the image segment. In one example, the image segment may include all portions of the image that include a particular structure and the contours of the segment may closely align with the counters of the structure. A contour may include the structure's left edge, right edge, top edge, bottom edge, inner edge, outer edge, other contour, or a combination thereof. Each edge may be made up of multiple points and each point may have a location along one or more axis (e.g., 2D position or coordinates). The processing device may identify a first point on the first edge and a second point on a second edge. The second edge may correspond an edge of the same structure or an edge of a different structure.

The processing device may calculate one or more of the plurality of image measurements based on one or more distances between the points. In one example, an image measurement may represent an image distance and may be calculated based on the number of pixels between the points. In another example, the image measurement may represent a physical distance between the points of the product and may be calculated based on the pixel distance, a focal length of the image capture device, the distance between the image capturing device and the product, other data, or a combination thereof. In either example, the processing device may determine multiple image measurements between multiple different pairs of points.

The processing device may determine image measurements along multiple axes (e.g., all rows and all columns) of the image, segmentation map, segment, group of segments, structure, product, other element, or a combination thereof. This may involve determining a first set of image measurements along a first axis (e.g., horizontal axis, X axis) and a second set of image measurements along a second axis (e.g., vertical axis, Y axis). Each set may include multiple measurements along the respective axis and in one example each set may include an image measurement for every element or pixel along the axis. For example, the first set may include a distance measurement for each pixel row of the segment and the second set may include a distance measurement between for each pixel column of the segment.

Identifying the image measurements may involve performing one or more scans along each of the multiple axes. Each of the scans may be an iterative analysis along a dimension and a first scan may be along a first dimension and a second scan may be along a second dimension. The scans may be the same or similar to a raster scan, rasterized scan, rasterization, or other scan. In one example, a first scan (e.g., horizontal raster scan) may be an iterative analysis that starts at a first set of elements (e.g., first row) along first dimension and analyzes each element in the first set before moving to a an adjacent set (e.g., second row). A second scan (e.g., vertical raster scan) may be an iterative analysis that starts at a first set of elements along a second dimension (e.g., first column) and analyzes each element in the first set before moving to an adjacent set in the second dimension (e.g., second column).

Each scan may iterate through the image or segmentation map and record distances between interesting elements. An interesting element may correspond to a point (e.g., pixel) associated with one of the structures and may indicate a beginning, middle, or end of the structure along one or more dimensions (e.g., top/bottom or left/right). The point may be based on the contour of the structure (e.g., center point) or along the contour of the structure such as at an edge or combination of edges (e.g., corner). As the scan iterates through the set of elements (e.g., a pixel row), the processing device may identify multiple interesting elements and determine distances between one or more pairs of the interesting elements. In one example, the multiple interesting elements may correspond to a first structure left edge, the first structure a right edge, a second structure left edge, and a second structure right edge. The distances may then include the thickness or length of structures (e.g., distance between the left and right edges of a structure), gap between structures (e.g., distance between right edge of first structure and left edge of second structure), separation of the structures (e.g., distance between center, left, or right of different structures), other distance, or a combination thereof.

At block 307, the processing device may store the plurality of image measurements. The image measurements may be stored in a persistent or non-persistent storage device and may or may not be associated (e.g., linked) with the image. The image measurements may be stored as image data, image layer data, metadata, other data, or a combination thereof. In one example, the image measurements may be stored with the image in the same data structure (e.g., file, record, stream). In another example, the image measurements and the image may be stored as separate data structures that may or may not be linked with one another (e.g., unidirectionally or bidirectionally linked).

The image measurements that are stored may be a complete set of a subset of all the determined image measurements. In the latter, the processing device may select the plurality of image measurements from a set of image measurements of the plurality of structures, wherein the plurality of image measurements comprise a plurality of horizontal measurements and a plurality of vertical measurements.

Responsive to completing the operations described herein above with references to block 308, the method may terminate.

Figure 4:
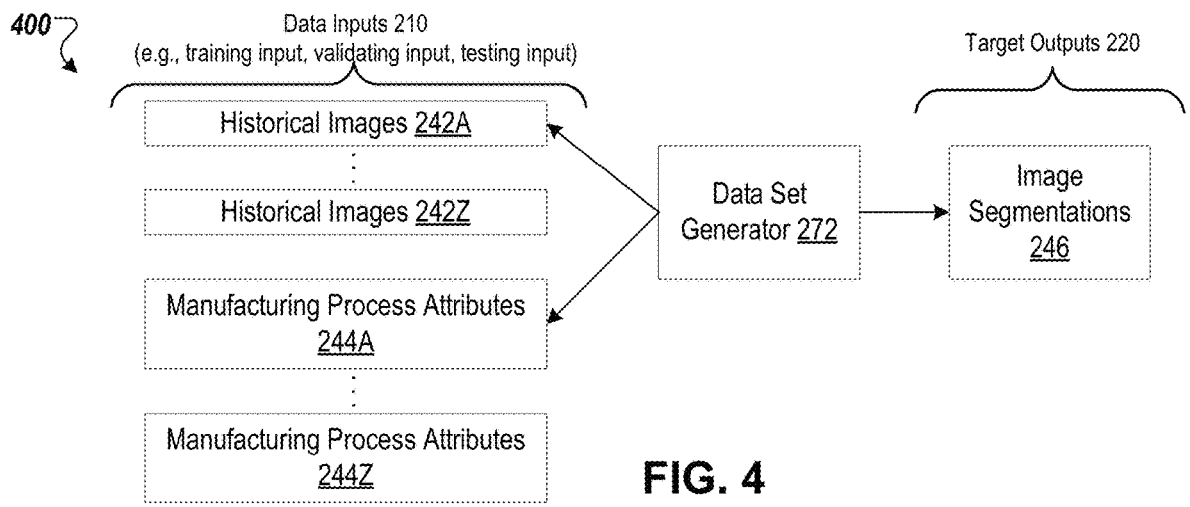
FIG. 4 is an example data set generator to create data sets for training a machine learning model, according to certain embodiments.
Figure 5:
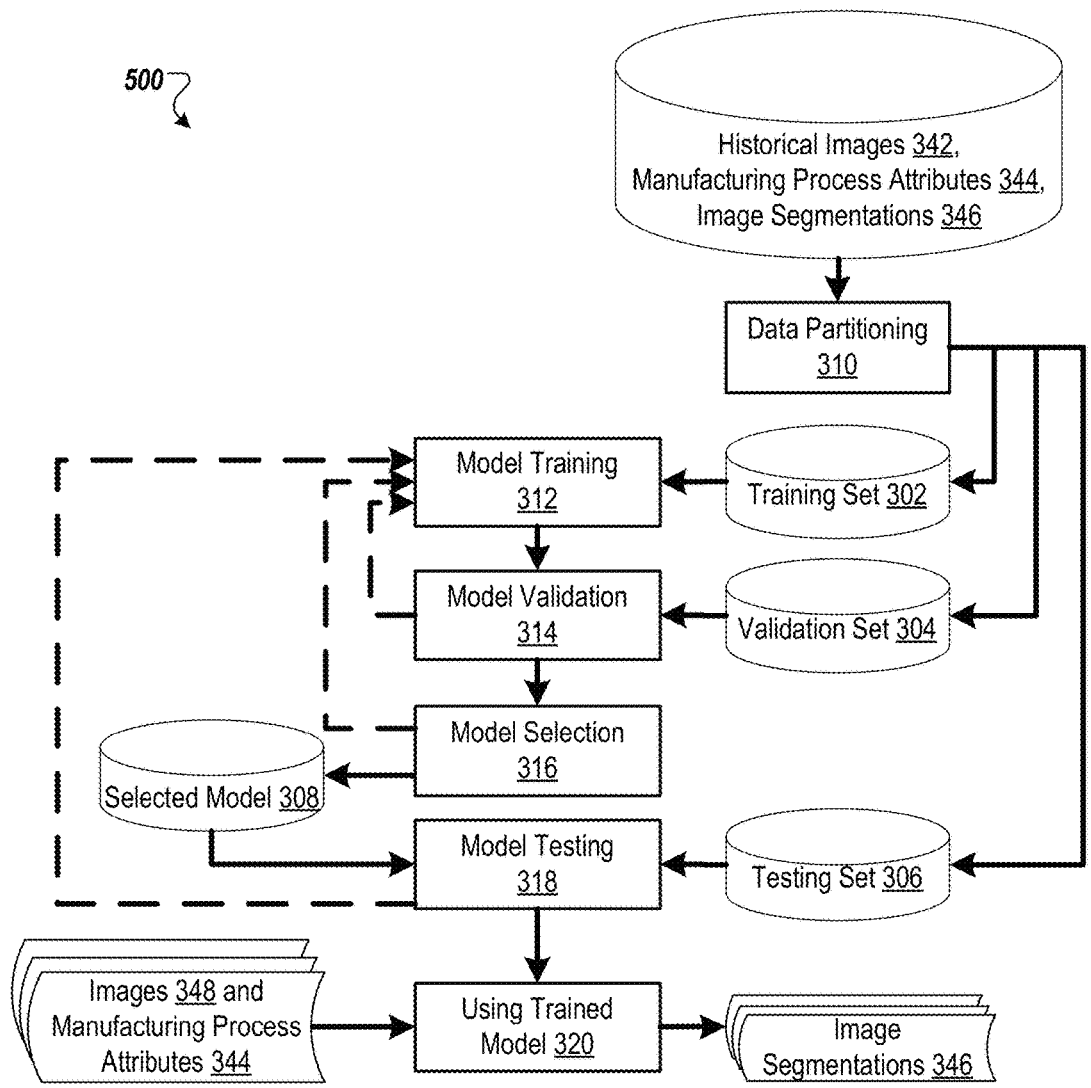
FIG. 5 is a block diagram illustrating a system for training and selecting the machine learning model, according to certain embodiments.
Figure 6:
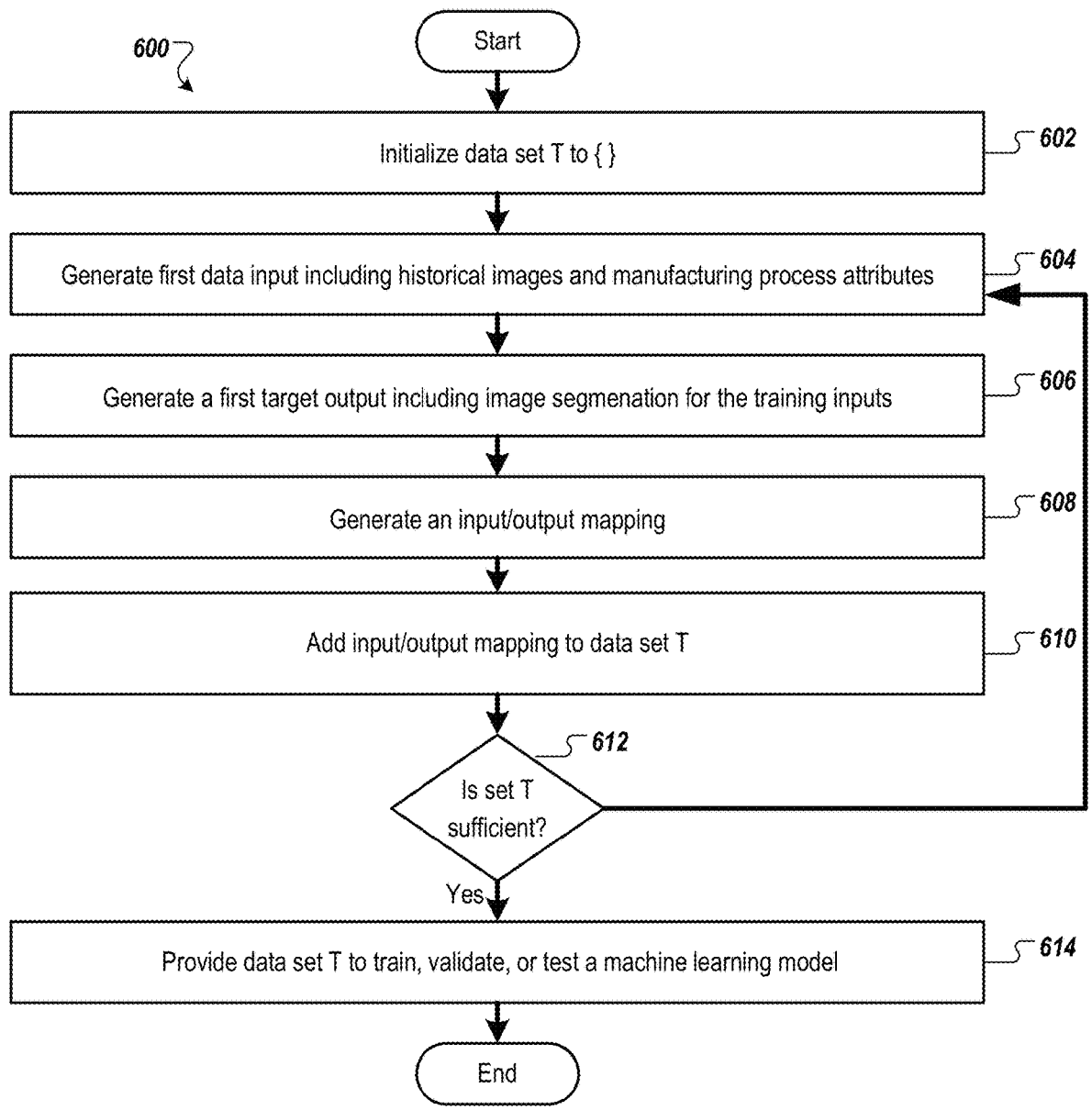
FIG. 6 is a flow diagram illustrating an example method of generating data sets for performing image segmentation, according to certain embodiments.

In other examples of method 300, the processing device may also identify a training set as discussed in regards to FIG. 4, train a model as discussed in regards to FIG. 5, or update one or more manufacturing parameters of the manufacturing process based on an image measurement as discussed in regards to FIG. 6.

FIG. 4 is an example data set generator 272 (e.g., data set generator 172 of FIG. 1) to create data sets for a machine learning model (e.g., model 190 of FIG. 1) using historical images 242 (e.g., historical images 142 of FIG. 1), according to certain embodiments. System 400 of FIG. 4 shows data set generator 272, data inputs 210, and target outputs 220.

In some embodiments, data set generator 272 generates a data set (e.g., training set, validating set, testing set) that includes one or more data inputs 210 (e.g., training input, validating input, testing input) and one or more target outputs 220 that correspond to the data inputs 210. The data set may also include mapping data that maps the data inputs 210 to the target outputs 220. Data inputs 210 may also be referred to as "features," "attributes," or "information." In some embodiments, data set generator 272 may provide the data set to the training engine 182, validating engine 184, or testing engine 186, where the data set is used to train, validate, or test the machine learning model 190. Some embodiments of generating a training set may further be described with respect to FIG. 6.

In some embodiments, data inputs 210 may include one or more of historical images 242 (e.g., historical images 142 of FIG. 1), manufacturing process attributes 244 (e.g., manufacturing process attributes 144 of FIG. 1), etc. Each instance of manufacturing process attributes 244 may include one or more process parameters, hardware parameters, etc. Target outputs 220 may include image segmentations 246 (e.g., image segmentation 146 of FIG. 1). The image segmentations may include segmentation data (e.g., ground truth annotations) and may be associated with process information, one or more image processing algorithms, image enhancement processes and/or image measurement algorithms.

In some embodiments, data set generator 272 may generate a first data input corresponding to a first set of features (e.g., one or more first manufacturing process attributes 244) to train, validate, or test a first machine learning model and the data set generator 272 may generate a second data input corresponding to a second set of features (e.g., one or more second manufacturing process attributes 244) to train, validate, or test a second machine learning model.

In some embodiments, the data set generator 272 may discretize one or more of the data input 210 or the target output 220. Discretization of the data input 210 or target output 220 may transform continuous values of variables into discrete values. In some embodiments, the discrete values for the data input 210 indicate discrete manufacturing process attributes 244.

Data inputs 210 and target outputs 220 that are used to train, validate, or test a machine learning model may include information for a particular facility (e.g., for a particular semiconductor manufacturing facility). For example, the historical images 242, manufacturing process attributes 244, and image segmentations 246 may be for the same manufacturing facility as the images 148.

In some embodiments, the information used to train the machine learning model may be from specific types of manufacturing equipment 124 of the manufacturing facility having specific characteristics. The trained machine learning model may determine outcomes for a specific group of manufacturing equipment 124 based on data input 210 associated with one or more components sharing characteristics of the specific group. In some embodiments, the information used to train the machine learning model may be for components from two or more manufacturing facilities and may allow the trained machine learning model to determine outcomes for components based on input from one manufacturing facility.

In some embodiments, subsequent to generating a data set and training, validating, or testing machine learning model 190 using the data set, the machine learning model 190 may be further trained, validated, tested (e.g., using manually annotated image segmentations, etc.), or adjusted (e.g., adjusting weights associated with input data of the machine learning model 190, such as connection weights or biases in a neural network).

FIG. 5 is a block diagram illustrating a system 500 for training and selecting a model to perform image segmentation. System 500 (e.g., image measurement system 110 of FIG. 1) may perform data partitioning (e.g., via data set generator 172 of server machine 170 of FIG. 1) of the historical images 342 (e.g., historical images 142 of FIG. 1) to generate the training set 302, validation set 304, and testing set 306. For example, the training set may be 60% of the historical images 342, the validation set may be 20% of the historical images 342, and the validation set may be 20% of the historical images 342. The system 500 may generate a plurality of sets of features for each of the training set, the validation set, and the testing set. For example, if the manufacturing process attributes 344 has 20 manufacturing process attributes (e.g., process parameters, hardware parameters, etc.) and 100 runs for each manufacturing process attribute, a first set of features may be manufacturing process attributes 1-10, a second set of features may be manufacturing process attributes 11-20, the training set may be runs 1-60, the validation set may be runs 61-80, and the testing set may be runs 81-100. In this example, the first set of features of the training set would be manufacturing process attributes 1-10 of runs 1-60.

At block 312, the system 500 performs model training (e.g., via training engine 182 of FIG. 1) using the training set 302. The system 500 may train multiple models using multiple sets of features of the training set 302 (e.g., a first set of features of the training set 302, a second set of features of the training set 302, etc.). For example, system 500 may train a machine learning model using the first set of features in the training set (e.g., annotated images) and to generate a second trained machine learning model using the second set of features in the training set (e.g., manufacturing process attributes). In some embodiments, the first trained machine learning model and the second trained machine learning model may be used to generate a third trained machine learning model (e.g., which may be a better predictor than the first or the second trained machine learning model on its own). In some embodiments, sets of features used in comparing models may overlap. In some embodiments, hundreds of models may be generated including models based on the same training set or on different training sets.

At block 314, the system 500 performs model validation (e.g., via validation engine 184 of FIG. 1) using the validation set 304. The system 500 may validate each of the trained models using a corresponding set of features of the validation set 304. For example, system 500 may validate the first trained machine learning model using the first set of features in the validation set (e.g., first group of annotated images)

and the second trained machine learning model using the second set of features in the validation set (e.g., second group of annotated images). In some embodiments, the system 500 may validate hundreds of models (e.g., models with various permutations of features, combinations of models, etc.) generated at block 312. At block 314, the system 500 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 312 where the system 500 performs model training using different sets of features of the training set. Responsive to determining that one or more of the trained models has an accuracy that meets a threshold accuracy, flow continues to block 316. The system 500 may discard the trained machine learning models that have an accuracy that is below the threshold accuracy (e.g., based on the validation set).

At block 316, the system 500 performs model selection (e.g., via selection engine 315) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow may return to block 312 where the system 500 performs model training using further refined training sets corresponding to further refined sets of features for determining a trained model that has the highest accuracy.

At block 318, the system 500 performs model testing (e.g., via testing engine 186 of FIG. 1) using the testing set 306 to test the selected model 308. The system 500 may test, using the first set of features in the testing set (e.g., group of annotated images), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and not applicable to other data sets such as the testing set 306), flow continues to block 312 where the system 500 performs model training (e.g., retraining) using different training sets corresponding to different sets of features. Responsive to determining that the selected model 308 has an accuracy that meets a threshold accuracy based on the testing set 306, flow continues to block 320. In at least block 312, the model may learn patterns in the historical images 342 to make predictions and in block 318, the system 500 may apply the model on the remaining data (e.g., testing set 306) to test the predictions.

At block 320, system 500 uses the trained model (e.g., selected model 308) to analyze images 348 and provide image segmentations 346 (e.g., segmentation maps for each image). In some embodiments, responsive to determining image segmentation of an image, flow may continue to block 312 (e.g., via a feedback loop that is not shown) where the image segmentation, image, manufacturing process attributes, or a combination thereof may be used to update the trained model via model training (e.g., model retraining).

In some embodiments, responsive to receiving additional data (e.g., additional historical images, ground truth feedback, corresponding manufacturing process attributes, and corresponding image segmentation), flow may continue to block 310 to re-train the trained machine learning model based on the additional data and the original data (e.g., historical images 342, manufacturing process attributes 344, and image segmentations 346 previously used to train the machine learning model).

In some embodiments, one or more of the acts 310-320 may occur in various orders and/or with other acts not presented and described herein. In some embodiments, one or more of acts 310-320 may not be performed. For example, in some embodiments, one or more of data partitioning of block 310, model validation of block 314, model selection of block 316, or model testing of block 318 may not be performed.

FIG. 6 is flow diagram illustrating example method 600 associated with performing image segmentation of images (e.g., images 148 of FIG. 1), according to certain embodiments. Method 600 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In one embodiment, method 600 may be performed, in part, by image measurement system 110. In some embodiments, method 600 may be performed by image measurement server 130. In some embodiments, a non-transitory storage medium stores instructions that when executed by a processing device (e.g., of image measurement system 110), cause the processing device to perform method 600.

For simplicity of explanation, method 600 are depicted and described as a series of acts. However, acts in accordance with this disclosure can occur in various orders and/or concurrently and with other acts not presented and described herein. Furthermore, not all illustrated acts may be performed to implement the method 600 in accordance with the disclosed subject matter. In addition, those skilled in the art will understand and appreciate that the method 600 could alternatively be represented as a series of interrelated states via a state diagram or events.

FIG. 6 is a flow diagram illustrating an example method of generating data sets for determining image segmentations (e.g., image segmentation 146 of FIG. 1), according to certain embodiments. Image measurement system 110 may use method 600 to at least one of train, validate, or test a machine learning model, in accordance with embodiments of the disclosure. In some embodiments, one or more operations of method 600 may be performed by data set generator 172 of server machine 170 as described with respect to FIGS. 1 and 2. It may be noted that components described with respect to FIGS. 1 and 2 may be used to illustrate aspects of FIG. 6.

Referring to FIG. 6, in some embodiments, at block 602 the processing logic implementing method 600 initializes a training set T to an empty set and at block 604 the processing logic generates first data input (e.g., first training input, first validating input) that includes historical images (e.g., historical images 142 of FIG. 1) and manufacturing process attributes (e.g., manufacturing process attributes 144 of FIG. 1). In some embodiments, the first data input may include a first set of features for manufacturing process attributes and a second data input may include a second set of features for the manufacturing process attributes (e.g., as described with respect to FIGS. 2-3).

At block 606, processing logic generates a first target output for one or more of the data inputs (e.g., first data input). The first target output provides an indication of image classification (e.g., image segmentation 146 of FIG. 1).

At block 608, processing logic optionally generates mapping data that is indicative of an input/output mapping. The input/output mapping (or mapping data) may refer to the data input (e.g., one or more of the data inputs described herein), the target output for the data input (e.g., where the target output identifies image classification), and an association between the data input(s) and the target output.

At block 610, processing logic adds the mapping data generated at block 610 to data set T.

At block 612, processing logic branches based on whether data set T is sufficient for at least one of training, validating, or testing machine learning model 190. If so, execution proceeds to block 614, otherwise, execution continues back at block 604. It should be noted that in some embodiments, the sufficiency of data set T may be determined based simply on the number of input/output mappings in the data set, while in some other implementations, the sufficiency of data set T may be determined based on one or more other criteria (e.g., a measure of diversity of the data examples, accuracy, etc.) in addition to, or instead of, the number of input/output mappings.

At block 614, processing logic provides data set T to train, validate, or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In some embodiments, input values of a given input/output mapping (e.g., numerical values associated with data inputs 210) are input to the neural network, and output values (e.g., numerical values associated with target outputs 220) of the input/output mapping are stored in the output nodes. The connection weights of the machine learning model are then adjusted in accordance with a learning algorithm (e.g., back propagation, etc.), and the procedure is repeated for the other input/output mappings in data set T. After block 614, machine learning model (e.g., machine learning model 190) can be at least one of trained using training engine 182 of server machine 180, validated using validating engine 184 of server machine 180, or tested using testing engine 186 of server machine 180. The trained machine learning model may be implemented by image measurement component 132 (of image measurement server 130) to perform image segmentation on the images.

To train, validate, or test the machine learning model, each image may be labeled or annotated with the corresponding image segments. In some embodiments, subsequent to the training of the machine learning model, the image processing algorithm and the process information are received (e.g., generated) for each image segment variations. The image processing algorithm and the process information may be based on manual measurements of the images used for training, validating, or testing the machine learning model.

In some embodiments, upon receiving one or more additional images from one or more image segments, the processing logic may retrain (e.g., and revalidate and retest) the trained machine learning model (e.g., based on the additional images and the images previously used to train the machine learning model. By retraining the trained machine learning model, the hyperparameters (e.g., layers in neural network, etc.) may be updated to use the hyperparameters that provide the greatest accuracy (e.g., responsive to accuracy dropping from 90% initial accuracy to 80% current accuracy using a first hyperparameter, a second hyperparameter that provides 85% current accuracy may be used).

Figure 7:
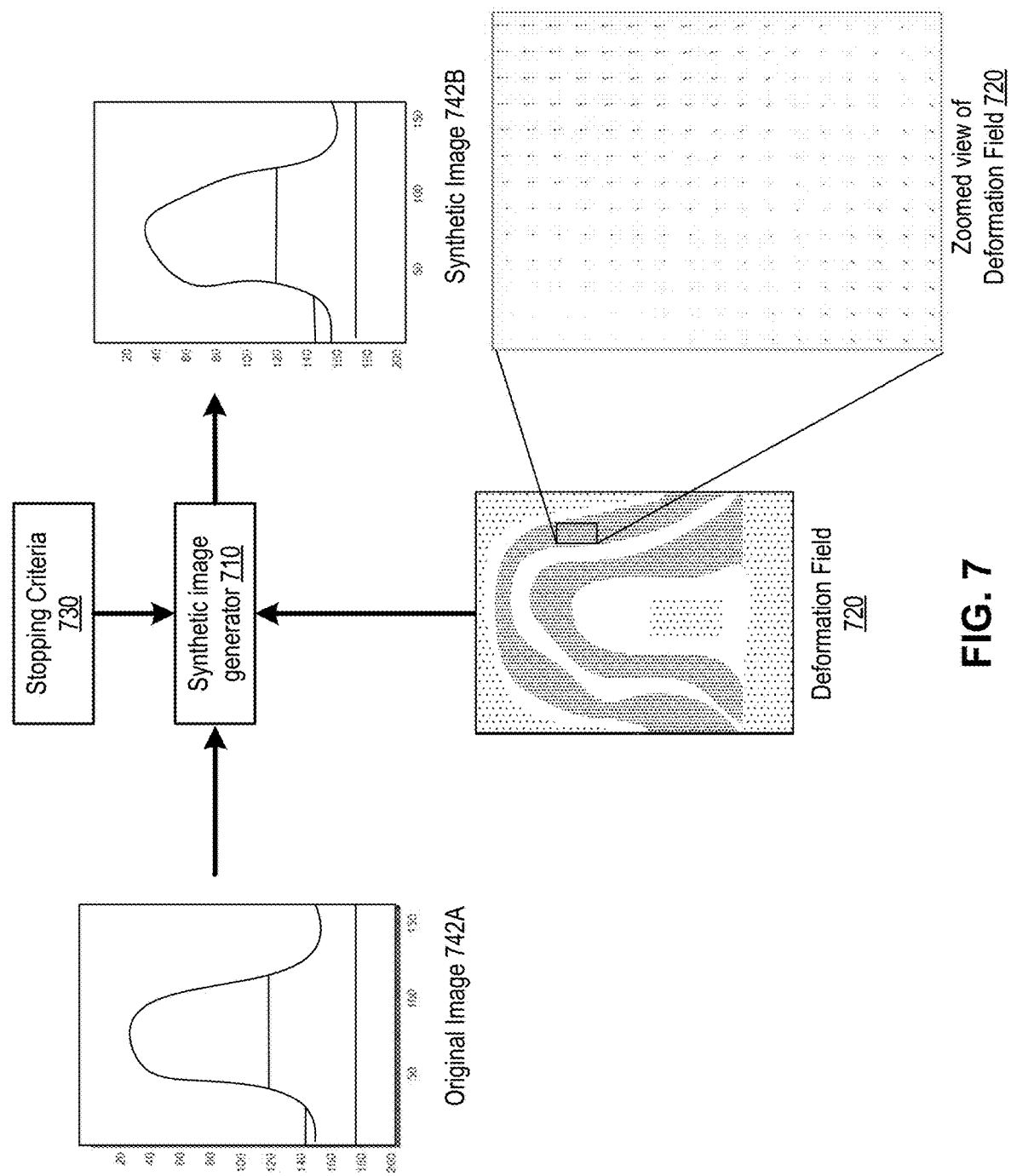
FIG. 7 is a block diagram illustrating a system for generating synthetic images, according to certain embodiments.

FIG. 7 is a block diagram illustrating a system 700 (e.g., image measurement system 110, server machine 170, data set generator 172 of FIG. 1) of generating synthetic images (e.g., synthetic images 142B of FIG. 1), according to certain embodiments.

In some embodiments, the system 700 may receive original images 742A (e.g., original images 142A of FIG. 1) and may determine that the original images 742A are insufficient to train a machine learning model. The system 700 may provide the original images 742A to a synthetic image generator 710 (e.g., server machine 170, data set generator 172 of FIG. 1) of the system 700.

The synthetic image generator 710 may be an iterative algorithm that changes the position (e.g., in direction and magnitude) of individual values at corresponding locations (e.g., pixels) in the original image 742A to updated corresponding locations (e.g., updated pixels) based on a randomly initialized deformation field 720. Each value corresponding to a pixel may move in eight directions (e.g., up, up-right, right, right-down, down, down-left, left, left-up) independently and still follow the global similarity criteria with the original image 742A. After each iteration, the deformation field 720 may be updated. The number of iterations and a sum of squared error (SSE) (e.g., global SSE) can be used as stopping criteria 730 for the algorithm. The sum of squared error (SSE) may be calculated by the following equation:

$$SSE = \Sigma_{i=1}^{k} \Sigma_{x \in C_i} d(x, m_i)^2$$

where k is the number of clusters, $C_i$ is the i-th cluster, x is a data point in cluster $C_i$ and $m_i$ is the representative point (e.g., centroid, mean vector of all data points in $C_i$) for cluster $C_i$, and $d(x, m_i)$ is a distance (Euclidian distance) between data point x and representative point $m_i$.

FIG. 7 illustrates a deformation field 720 and a zoomed view of a portion of the deformation field 720. The deformation field 720 may indicate a direction and magnitude of targeted deformation for one or more pixels of the image (e.g., targeted deformation may move location of one edge in a target direction or any direction without moving other portions of an image). The deformation field 720 may have an equal or weighted probability of different directions.

The deformation field 720 may have vectors associated with each pixel that indicate a difference between the images that are compared (e.g., difference between the initial synthetic image and original image). The length of each vector may represent a magnitude of displacement between the original image and the current iteration of the synthetic image. The deformation field 720 (e.g., displacement field) may be a vector field of all displacement vectors for all particles in a body (e.g., continuum body, product displayed in an original image), which relates the deformed configuration (e.g., synthetic image) with the undeformed configuration (e.g., original image). The analysis of deformation of the body may be in terms of the deformation field. In general, the deformation field may be expressed in terms of the material coordinates as:

$$u(X,t) = b(X,t) + x(X,t) - X, \text{ or } u_i = \alpha_{iJ} b_J + x_i - X_J$$

or in terms of the spatial coordinates as:

$$U(x,t) = b(x,t) + x - X(x,t), \text{ or } U_J = b_J + \alpha_{Ji} x_i - X_J,$$

where $\alpha_{Ji}$ are the direction cosines between the material and spatial coordinate systems with unit vectors $E_J$ and respectively. Thus, $E_J \cdot e_i = \alpha_{ji} = \alpha_{i,J}$ and the relationship between $u_i$ and $U_J$ is then given by $u_i = \alpha_{i,J} U_J$ or $U_J = \alpha_{j,i} u_i$ Knowing that $e_i = \alpha_{i,J} E_J$, then $u(X, t) = u_i e_i = u_i (\alpha_{i,J} E_J) = U_J E_J = U(x, t)$. The coordinate systems for the undeformed and deformed configurations may be superimposed, which results in b=0, and the direction cosines may become Kronecker deltas: $E_J \cdot e_i = \delta_{ji} = \delta_{i,J}$ Thus, we have: $u(X, t) = x(X, t) - X$, or $u_i = x_i - \delta_{i,J} X_J = x_i - X_i$ or in terms of the spatial coordinates as: $U(x, t) = x - X(x, t)$ or $U_J = \delta_{ji} x_i - X_J = x_J - X_J$ The deformation field 720 may be used to further adjust the synthetic image. Points on one or more edges of the synthetic image may be moved in a direction according to the deformation field 720, for example. A zoomed in portion of the deformation field 720 may indicate some values in the image corresponding to particular pixels are to move in a first direction, others in a second direction, etc. Values of pixels corresponding to the shape of the edges of the features that are to be deformed may have an associated magnitude of deformation based on the difference between the compared images (e.g., larger magnitude for larger difference, smaller magnitude based on smaller difference, no deformation based on no difference, etc.).

In some embodiments, the deformation field 720 is a probability of pixel value changing. The deformation field 720 may be weighted based on differences between images and process information (e.g., the manufacturing process may produce products with differences in certain dimensions).

The synthetic image generator 710 may generate one or more synthetic images 742B (e.g., synthetic images 142B of FIG. 1) for each original image 742A. The original images 742A and synthetic images 742B in combination may be sufficient to train the machine learning model.

To generate a synthetic image 742B, the synthetic image generator 710 may perform feature extraction to identify features of a first original image 742A that are expected to change based on manufacturing parameters of the manufacturing process. To generate the synthetic image 742B, the synthetic image generator 710 may further perform targeted deformation of one or more features of the first original image 742A.

In some embodiments, the synthetic image generator 710 may determine stopping criteria 730 for the targeted deformation based on a critical dimension of the product. The synthetic image generator 710 may perform the targeted deformation by iteratively moving one or more points on a feature until a threshold number of iterations have completed or the stopping criteria 730 is reached. The targeted deformation may be in a designated direction of movement.

In some embodiments, the first synthetic image 742B is further generated based on a targeted deformation field 720 that is randomly initialized. The synthetic image generator 710 may compare the synthetic image 742B to a original image of the original images to determine differences. The synthetic image generator 710 may update the deformation field 720 based on the differences to generate an updated deformation field 720. The synthetic image generator 710 may generate a second synthetic image by adjusting the first original image based on the updated deformation field 720. The deformation field 720 may include pixel value adjustments that have a weighted probability based on process information (e.g., process information 150 of FIG. 1).

In some embodiments, the first synthetic image 742B is generated by performing a combination of targeted deformation and global deformation of the first original image 742A. The global deformation may include one or more of flipping, shifting, rotating, zooming in, zooming out, etc. the first original image 742A. The global deformation may be performed before or after performing the targeted deformation.

Figure 8:
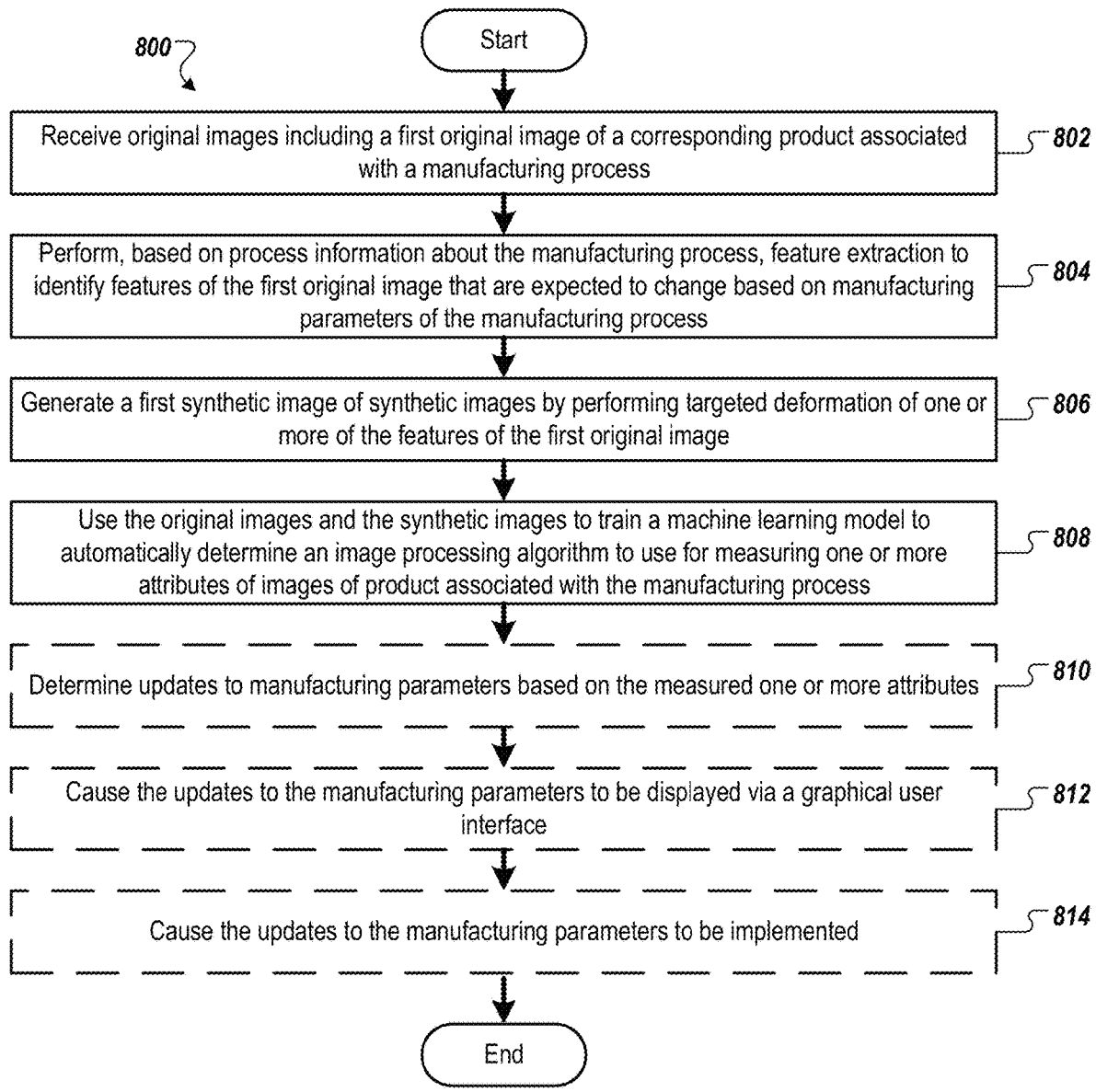
FIG. 8 is a flow diagram illustrating an example method of generating synthetic images, according to certain embodiments.

FIG. 8 is a flow diagram illustrating an example method 800 of generating synthetic images (e.g., synthetic images 142B of FIG. 1), according to certain embodiments. Method 800 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In one embodiment, method 800 may be performed, in part, by image measurement system 110. In some embodiments, method 800 may be performed by image measurement server 130. In some embodiments, a non-transitory storage medium stores instructions that when executed by a processing device (e.g., of image measurement system 110) cause the processing device to perform method 800.

For simplicity of explanation, method 800 is depicted and described as a series of acts. However, acts in accordance with this disclosure can occur in various orders and/or concurrently and with other acts not presented and described herein. Furthermore, not all illustrated acts may be performed to implement the method 800 in accordance with the disclosed subject matter. In addition, those skilled in the art will understand and appreciate that the method 800 could alternatively be represented as a series of interrelated states via a state diagram or events.

Referring to FIG. 8, at block 802 the processing logic receives original images (e.g., original images 142A of FIG. 1) including a first original image. Each original image of the plurality of original images is of a corresponding product associated with a manufacturing process (e.g., performed by manufacturing equipment 124 of FIG. 1). In some embodiments, to train a machine learning model, a threshold amount of images may be used and the threshold amount may be based on enough images to determine a delta or range of one or more dimensions to be measured using one or more of an image processing algorithm (e.g., an image measurement algorithm) or process information (e.g., a range of 50-60 nm is determined using at least 150 images). In some embodiments, the processing logic determines that the amount of original images (e.g., less than 150 images) is insufficient to train the machine learning model. The operations of blocks 804-808 may be performed responsive to determining that the amount of original images is insufficient to train the machine learning model.

At block 804, the processing logic performs, based on process information (e.g., processing information 150 of FIG. 0.1) about the manufacturing process, feature extraction on the first original image to identify features of the first original image that are expected to change based on changes to manufacturing parameters (e.g., manufacturing parameters 156) of the manufacturing process. The process information may indicate structure of the product in the images, range of dimensions, whether certain dimensions may shrink or increase from image to image (e.g., based process parameters), which dimensions are important, etc. The processing logic may determine edges of the product in the image that are to come closer together and are to move further apart based on the manufacturing parameters (e.g., are to have a dimension that is within a range).

At block 806, the processing logic generates a first synthetic image of synthetic images (e.g., synthetic images 142B of FIG. 1) by performing targeted deformation of one or more of the features of the first original image. The targeted deformation adjusts one or more of the features. The processing logic may move every point along an identified edge to generate one or more synthetic images (e.g., move every point along an identified edge one pixel to the left for a first synthetic image, move every point along the identified edge another pixel to the left for a second synthetic image, etc.).

In some embodiments, the processing logic generates an initial synthetic image based on random deformation of the edges (e.g., based on a first original image and a random deformation field) and then generates subsequent synthetic images based on targeted deformation. The processing logic may determine locations corresponding to differences between the initial synthetic image and a second original image and perform targeted deformation at those locations (e.g., without deforming other portions of the image).

In some embodiments, the processing logic determines stopping criteria (e.g., stopping criteria 730 of FIG. 7) for the targeted deformation based on a critical dimension of the product. The processing logic may perform the targeted deformation by iteratively moving one or more points on a feature (e.g., moving one or more points one pixel to the left in the first iteration, moving the one or more points another pixel to the left in the second iteration, etc.) until a threshold number of iterations have completed or the stopping criteria is reached. The targeted deformation may be in a designated direction of movement. The stopping criteria may be used so that the synthetic images would be in the same image classification as the original images (e.g., the synthetic images would not be so distorted that they are no longer recognized as the same image classification as the original images). The processing logic may determine the stopping criteria based on the process information (e.g., process information indicates a range of 400-500 nm and the stopping criteria would allow iterations as long as the dimension is still between 400 and 500 nm (e.g., allow to shrink until 400 nm and allow to increase until 500 nm)).

In some embodiments, the first synthetic image is further generated based on a deformation field (e.g., deformation field 720 of FIG. 7) that may be randomly initialized. If the deformation field is randomly initialized, then the initial displacement of each point on the edges may be in a random direction. The processing logic may then compare the synthetic image to an original image of the original images to determine differences there between after the initial displacement. The processing logic may update the deformation field based on the differences to generate an updated deformation field. The processing logic may generate a second synthetic image by adjusting the first original image based on the updated deformation field. In some embodiments, the deformation field includes pixel value adjustments that have a weighted probability based on process information.

In some embodiments, the first synthetic image is further generated by performing a global deformation of the first original image. In some embodiments, the global deformation includes one or more of flipping, shifting, rotating, zooming in, zooming out, etc. the first original image. In some embodiments, a first set of synthetic images are generated by performing targeted deformations to original images. In some embodiments, a second set of synthetic images are generated by performing global deformations to original images. In some embodiments, a third set of synthetic images are generated by performing both targeted and global deformations to the original images.

At block 808, the processing logic uses the original images and the synthetic images to train a machine learning model (e.g., model 190 of FIG. 1) to automatically determine one or more image processing algorithms (e.g., one or more image processing algorithms 149 of FIG. 1) to use for measuring one or more attributes of images (e.g., images 148) of product associated with the manufacturing process. The original images and the synthetic images in combination may be sufficient to train the machine learning model.

In some embodiments, at block 810, the processing logic determines updates to the manufacturing parameters based on the measured one or more attributes (e.g., image measurements 154 of FIG. 1). Block 810 may be similar to block 514 of FIG. 5.

In some embodiments, at block 812, processing logic causes the updates to the manufacturing parameters to be displayed via a graphical user interface (e.g., via client device 120, etc.). For example, an alert may be transmitted to a client device of an administrator of the facility.

In some embodiments, at block 814, process logic causes the updates to the manufacturing parameters to be implemented (e.g., by the manufacturing equipment 124). In some embodiments, the processing logic causes the manufacturing equipment to shut down based on the image measurements or the updates to the manufacturing parameters (e.g., update of a hardware change, update of a process change, etc.).

Figure 9:
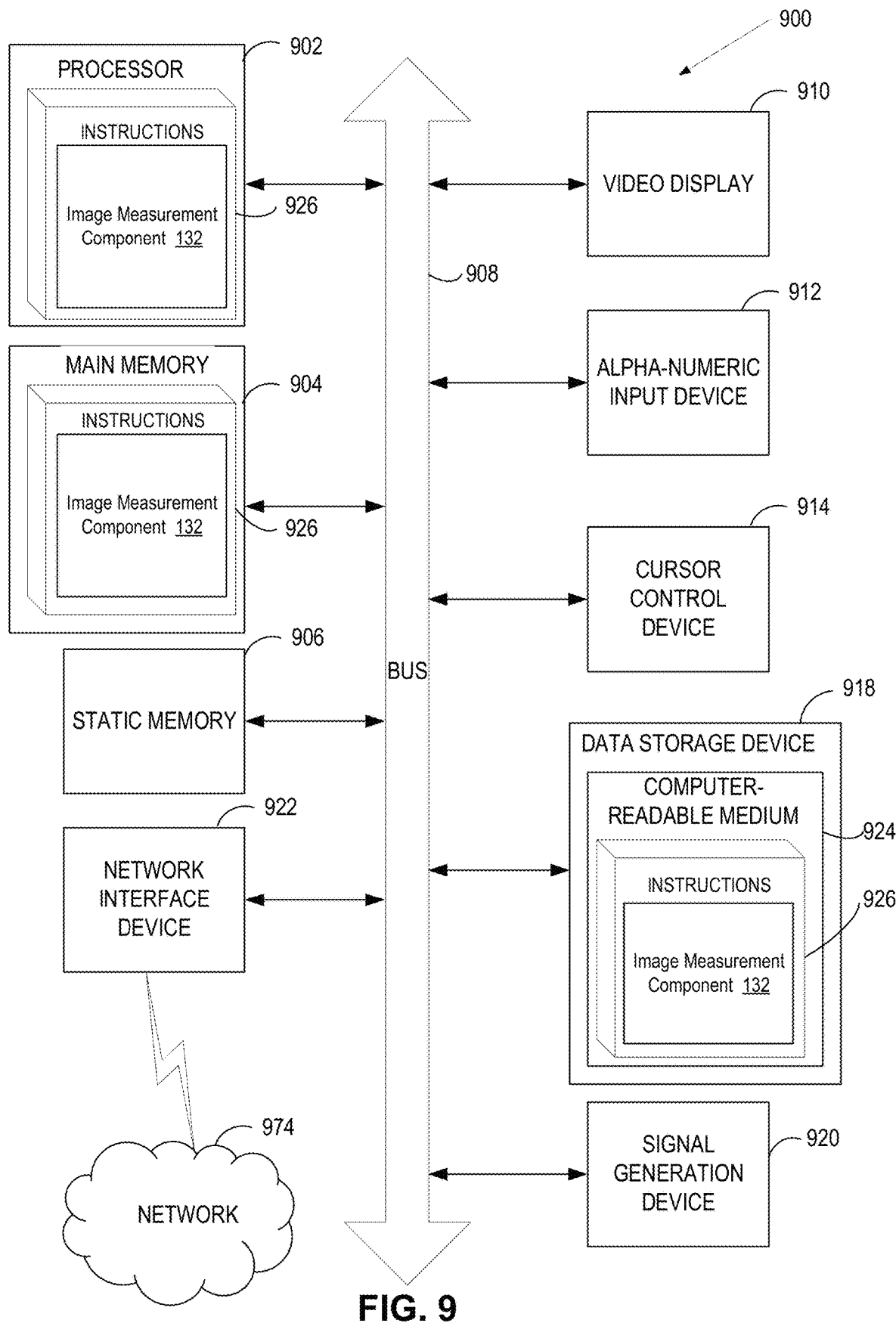
FIG. 9 is a block diagram illustrating a computer system, according to certain embodiments.

FIG. 9 is a block diagram illustrating a computer system 900, according to certain embodiments. In some embodiments, computer system 900 may be connected (e.g., via a network, such as a Local Area Network (LAN), an intranet, an extranet, or the Internet) to other computer systems. Computer system 900 may operate in the capacity of a server or a client computer in a client-server environment, or as a peer computer in a peer-to-peer or distributed network environment. Computer system 900 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 900 may include a processing device 902, a volatile memory 904 (e.g., random access memory (RAM)), a non-volatile memory 906 (e.g., read-only memory (ROM) or electrically-erasable programmable ROM (EEPROM)), and a data storage device 916, which may communicate with each other via a bus 908.

Processing device 902 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 900 may further include a network interface device 922. Computer system 900 also may include a video display unit 910 (e.g., an LCD), an alpha-numeric input device 912 (e.g., a keyboard), a cursor control device 914 (e.g., a mouse), and a signal generation device 920.

In some implementations, data storage device 916 may include a non-transitory computer-readable storage medium 924 on which may store instructions 926 encoding any one or more of the methods or functions described herein, including instructions encoding the image measurement component 132 (e.g., for determining an image measurement, for generating synthetic images, etc.) or manufacturing parameter modification component 122 of FIG. 1 and for implementing methods described herein.

Instructions 926 may also reside, completely or partially, within volatile memory 904 and/or within processing device 902 during execution thereof by computer system 900, hence, volatile memory 904 and processing device 902 may also constitute machine-readable storage media.

While computer-readable storage medium 924 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "determining," "selecting," "pre-processing," "measuring," "reporting," "updating," "inputting," "training," "creating," "adding," "failing," "causing," "performing," "generating," "using," "comparing," "flipping," "shifting," "rotating," "zooming," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   receiving an image of a product associated with a manufacturing process, wherein the product comprises a plurality of structures;
   identifying, using a trained machine learning model, a segment of the image that comprises a structure of the plurality of structures, wherein the trained machine learning model having been trained using 1) an original image generated by an image capturing device and 2) a plurality of synthetic images each generated by identifying a feature, in the original image, that is expect to change based on manufacturing parameters of the manufacturing process, and generating a variation in the feature by changing a position of at least one value, associated with the feature, from a first location to a second location;
   determining a plurality of image measurements of the segment that comprises the structure; and
   storing the plurality of image measurements.

2. The method of claim 1, wherein identifying the segment comprises performing instance segmentation using the trained machine learning model to identify a plurality of segments, wherein each of the plurality of segments comprises one of the plurality of structures.

3. The method of claim 1, wherein the trained machine learning model comprises a trained convolutional neural network that comprises a convolution operation that decreases spatial resolution of image data and a deconvolution operations that increases spatial resolution of the image data.

4. The method of claim 3, wherein the deconvolution operation comprises a convolution operation that uses a stride rate that is less than one.

5. The method of claim 1, wherein identifying the segment comprises generating a segmentation map that indicates pixels of the image that comprise the structure of the product associated with the manufacturing process.

6. The method of claim 1, wherein determining the plurality of image measurements comprises:
   detecting a first edge of the segment that comprises the structure;
   identifying a first point on the first edge and a second point on a second edge, wherein the second edge corresponds an edge of the structure or an edge of another structure of the plurality of structures; and
   calculating one of the plurality of image measurements based on a distance between the first point and second point.

7. The method of claim 1, wherein determining the plurality of image measurements comprises:
   determining a first set of image measurements along a first axis, wherein the first set comprises a distance between edges for each pixel row of the segment; and
   determining a second set of image measurements along a second axis, wherein the second set comprises a distance between edges for each pixel column of the segment; and
   selecting the plurality of image measurements from the first set and the second set.

8. The method of claim 1, further comprising selecting the plurality of image measurements from a set of image measurements of the plurality of structures, wherein the plurality of image measurements comprise a plurality of horizontal measurements from the set and a plurality of vertical measurements from the set.

9. The method of claim 1, further comprising updating a manufacturing parameter of the manufacturing process based on an image measurement of the plurality of image measurements.

10. A system comprising:
    a memory; and
    a processing device, coupled to the memory, to:
       access a first set of images, wherein the first set comprises a training image that is generated by an image capturing device and is annotated to indicate a portion of the training image comprising a product structure;
       create a second set of images based on the first set of images, wherein one or more image of the second set of images are created by:
          identifying a feature, in the training image, that is expect to change based on manufacturing parameters of a manufacturing process; and
          generating a variation in the feature by changing a position of at least one value, associated with the feature, from a first location to a second location; and
       train a machine learning model using the first set of images and the second set of images.

11. The system of claim 10, wherein the processing device is further to:
    receive an image of a product associated with a manufacturing process, wherein the product comprises a plurality of structures;
    identify, using the machine learning model, a segment of the image that comprises a structure of the plurality of structures;
    determine a plurality of image measurements of the segment that comprises the structure; and
    store the plurality of image measurements.

12. The system of claim 11, wherein to identify the segment, the processing device performs instance segmentation using the machine learning model to identify a plurality of segments, wherein each of the plurality of segments comprises one of the plurality of structures.

13. The system of claim 10, wherein the machine learning model comprises a convolutional neural network that comprises a convolution operation that decreases spatial resolution of image data and a deconvolution operations that increases spatial resolution of the image data.

14. The system of claim 13, wherein the deconvolution operation comprises a convolution operation that uses a stride rate that is less than one.

15. The system of claim 11, wherein to identify the segment, the processing device is to generate a segmentation map that indicates pixels of the image that comprise the structure of the product associated with the manufacturing process.

16. A method comprising:
    accessing, by a processing device, a set of images, wherein the set of images comprises an image associated with an annotation that indicates a portion of the image that comprises a structure;
    generating a synthetic image by:
       identifying a feature, in the image associated with the annotation, that is expected to change based on manufacturing parameters of a manufacturing process, and
       generating a variation in the feature by changing a position of at least one value, associated with the feature, from a first location to a second location;
    generating a machine learning model that comprises a resolution contracting layer that is based on a convolution operation and a resolution expanding layer that is based on a deconvolution operation;
    updating the machine learning model to change a value for the convolution operation and a value for the deconvolution operation based on the image associated with the annotation and the synthetic image; and
    storing, by the processing device to a data store, the machine learning model comprising the value for the convolution operation and the value for the deconvolution operation.

17. The method of claim 16, wherein the machine learning model comprises a convolutional neural network for analyzing an image of a product associated with a manufacturing process.

18. The method of claim 16, wherein the machine learning model receives an input image of a product and generates a segmentation map that indicates pixels of the input image that correspond to a structure of the product.

19. The method of claim 16, wherein the convolution operation decreases a spatial resolution of a feature map and the deconvolution operation increases the spatial resolution of the feature map.

20. The method of claim 16, wherein the deconvolution operation comprises a convolution operation that uses a stride rate that is less than one.

21. The method of claim 1, wherein the value comprises a pixel value.

* * * * *